(12) United States Patent
Zhang et al.

(10) Patent No.: US 10,658,481 B1
(45) Date of Patent: May 19, 2020

(54) SELF-ALIGNED GATE CUT IN DIRECT STACKED VERTICAL TRANSPORT FIELD EFFECT TRANSISTOR (VTFET)

(71) Applicant: International Business Machines Corporation, Armonk, NY (US)

(72) Inventors: Chen Zhang, Albany, NY (US); Tenko Yamashita, Schenectady, NY (US); Kangguo Cheng, Schenectady, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/173,532

(22) Filed: Oct. 29, 2018

(51) Int. Cl.
| | |
|---|---|
| H01L 29/76 | (2006.01) |
| H01L 29/423 | (2006.01) |
| H01L 29/78 | (2006.01) |
| H01L 27/12 | (2006.01) |
| H01L 21/762 | (2006.01) |
| H01L 29/51 | (2006.01) |
| H01L 21/308 | (2006.01) |
| H01L 29/66 | (2006.01) |
| H01L 21/033 | (2006.01) |

(52) U.S. Cl.
CPC .... H01L 29/42376 (2013.01); H01L 21/0337 (2013.01); H01L 21/3086 (2013.01); H01L 21/76243 (2013.01); H01L 27/1203 (2013.01); H01L 29/517 (2013.01); H01L 29/6656 (2013.01); H01L 29/66666 (2013.01); H01L 29/7827 (2013.01)

(58) Field of Classification Search
CPC ............ H01L 21/0337; H01L 21/3086; H01L 27/76243; H01L 29/517; H01L 29/6556
See application file for complete search history.

(56) References Cited

U.S. PATENT DOCUMENTS

| | | | |
|---|---|---|---|
| 6,770,534 | B2 | 8/2004 | Cho et al. |
| 7,683,428 | B2 | 3/2010 | Chidambarrao et al. |
| 8,409,948 | B2 | 4/2013 | Fischer et al. |
| 8,633,529 | B2 | 1/2014 | Juengling |
| 9,620,509 | B1 | 4/2017 | Pao et al. |
| 9,653,360 | B2 | 5/2017 | Anderson et al. |
| 9,997,413 | B1 | 6/2018 | Leobandung |
| 10,032,909 | B2 | 7/2018 | Cheng et al. |
| 2006/0261406 | A1 | 11/2006 | Chen |

*Primary Examiner* — Samuel A Gebremariam
(74) *Attorney, Agent, or Firm* — Amin, Turocy & Watson, LLP

(57) ABSTRACT

Structures and/or methods that facilitate self-aligned gate cut on a dielectric fin extension in direct stacked vertical transport field effect transistor (VTFET). A semiconductor structure can comprise a silicon on insulator (SOI) semiconductor fin comprising a dielectric fin extension. The semiconductor structure can further comprise a first vertical transport field effect transistor (VTFET) comprising a first self-aligned gate on the dielectric fin extension. The semiconductor structure can further comprise a second VTFET comprising a second self-aligned gate on the dielectric fin extension. The semiconductor structure can further comprise a gate contact extending through the dielectric fin extension through the second VTFET to the first self-aligned gate.

20 Claims, 17 Drawing Sheets

SELF-ALIGNED GATE CUT IN DIRECT STACKED VERTICAL TRANSPORT FIELD EFFECT TRANSISTOR (VTFET)

BACKGROUND

The subject disclosure relates to vertical transport field effect transistor (VTFET), and more specifically, to self-aligned gate cut in direct stacked VTFET.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments herein, devices and/or methods that facilitate self-aligned gate cut on a dielectric fin extension in direct stacked vertical transport field effect transistor (VTFET) are described.

According to one embodiment, a semiconductor structure is provided. The semiconductor structure can comprise a silicon on insulator (SOI) semiconductor fin comprising a dielectric fin extension. The semiconductor structure can further comprise a first vertical transport field effect transistor (VTFET) comprising a first self-aligned gate on the dielectric fin extension. The semiconductor structure can further comprise a second VTFET comprising a second self-aligned gate on the dielectric fin extension. The semiconductor structure can further comprise a gate contact extending through the dielectric fin extension through the second VTFET to the first self-aligned gate.

According to another embodiment, a method is provided. The method can comprise forming a silicon on insulator (SOI) semiconductor fin comprising a dielectric fin extension. The method can further comprise forming a first vertical transport field effect transistor (VTFET) comprising a first self-aligned gate on the dielectric fin extension. The method can comprise forming a second VTFET comprising a second self-aligned gate on the dielectric fin extension. The method can comprise forming a gate contact extending through the dielectric fin extension through the second VTFET to the first self-aligned gate.

According to another embodiment, a method is provided. The method can comprise forming a dielectric fin extension on a silicon on insulator (SOI) wafer. The method can comprise forming a first vertical transport field effect transistor (VTFET) and a second VTFET on an SOI semiconductor fin comprising the dielectric fin extension. The method can comprise forming a gate contact extending through the dielectric fin extension through the second VTFET to a self-aligned gate of the first VTFET.

DETAILED DESCRIPTION

Figure 1:
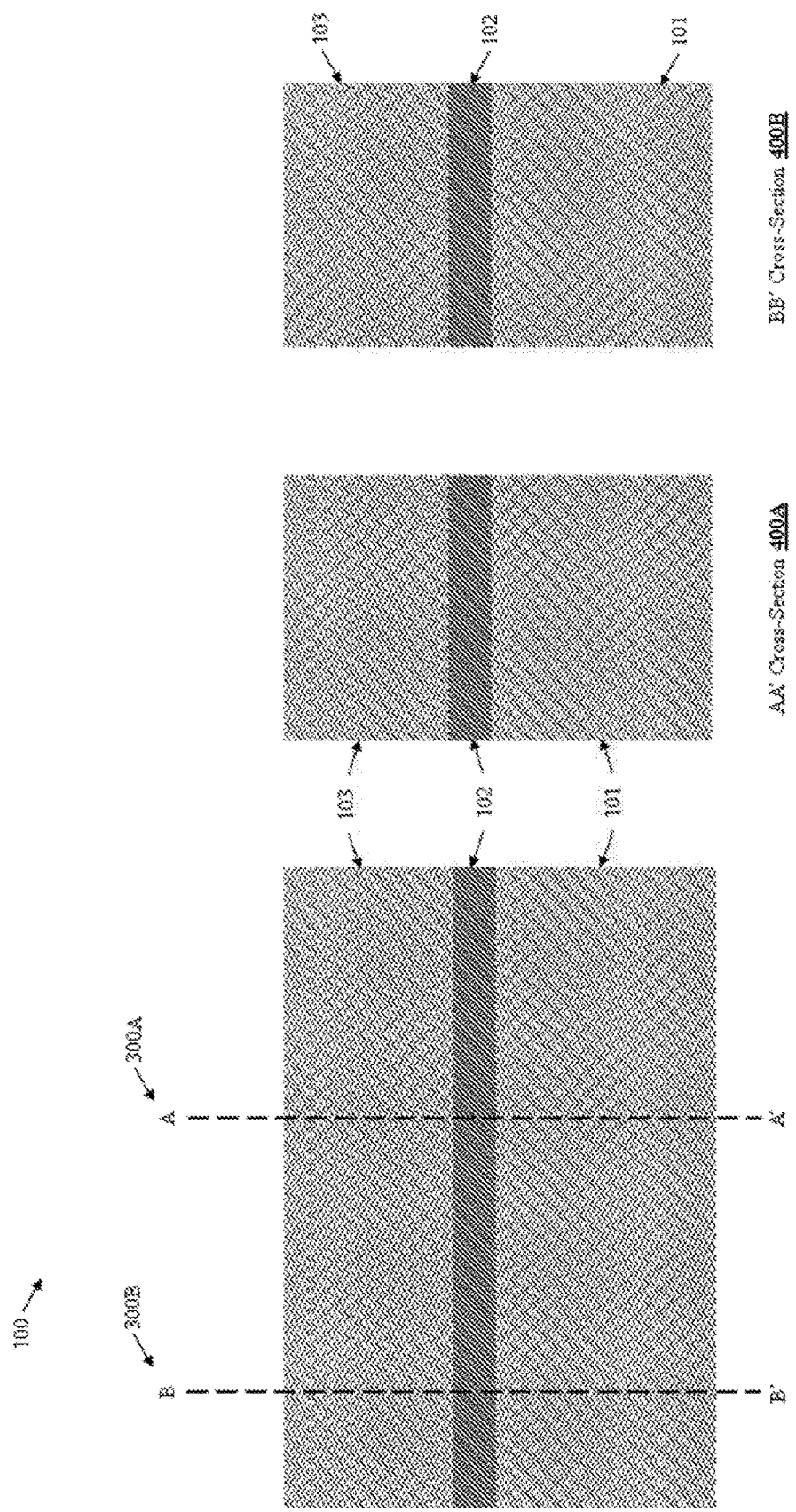
FIG. 1 illustrates an example, non-limiting cross-sectional diagram of a semiconductor structure facilitating self-aligned gate cut on a dielectric fin extension in direct stacked VTFET including a starting substrate having a semiconductor-on-substrate (SOI) layer separated from an underlying substrate by a buried insulator in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The embodiments described herein relates to structures and methods of forming a semiconductor device, and more specifically, self-aligned gate cut on a dielectric fin extension in direct stacked vertical transport field effect transistor (VTFET). One or more embodiments described herein relates to a self-aligned gate cut/patterning process used in fabricating vertical complementary metal-oxide-semiconductor field effect transport (CMOS FET) or VTFET. Gate patterning can be challenging given the ultra-high aspect ratio of the stacked fin in stacked VTFET. One or more embodiments described herein can provide a self-aligned gate cut process to facilitate gate formation. More specifically, the embodiments described herein relates stacking VTFETs on the same semiconductor fin with a dielectric fin extending the length of the semiconductor fin and the gate stacks cover both the semiconductor fin and the dielectric fin. Recessing the end of the dielectric fin extension can facilitate forming a common gate contact to the top and bottom VTFETs.

Stacking FETs in the vertical direction can provide an additional dimension for CMOS area scaling. However, stacking planar FETs can be challenging. Vertical transport field effect transistors on the other hand have a unique structure that can help the stacking process. Namely, as opposed to planar CMOS devices, VTFETs are oriented with a vertical fin channel disposed between a top and bottom source/drain. The gate (e.g., gate stack) can run vertically alongside the vertical fin channel.

Provided herein are techniques for forming stacked vertical n-channel and p-channel VTFETs (NFETs and PFETs). By comparison, typical VTFET layouts can include vertical NFETs and PFETs side-by-side one another on a wafer. Thus, in addition to the vertical orientation of the VTFET structure, the stacked VTFET designs can provide another dimension for CMOS area scaling.

An exemplary embodiment for forming a stacked VTFET (NFET and PFET) device is now described. Techniques for forming a self-aligned gate cut on a dielectric fin extension and gate contact to the device are also provided below. The stacked VTFET design can include an NFET and a PFET stacked in either order. Namely, configurations are contemplated herein in which either the NFET or the PFET is present at the bottom and top of the stack. Thus, both NFET stacked on PFET and PFET stacked on NFET designs are described herein. As such, in the description that follows, reference will be made to a bottom VFET (e.g., first VTFET) in the stack and a top VFET (e.g., second VTFET) in the stack. The bottom VFET can be either an NFET or a PFET. Likewise, the top WET can be either an NFET or a PFET.

As illustrated in FIG. 1, a self-aligned gate cut in direct stacked VTFET can begin with a silicon on insulator (SOI) wafer in which one or more fins can be patterned. FIG. 1 illustrates an example, non-limiting cross-sectional diagram of a semiconductor structure 100 including a starting substrate comprising an SOI layer 103 separated from a substrate layer 101 by a buried insulator 102 in accordance with one or more embodiments described herein. The buried insulator 102 can be disposed between an SOI wafer separating the SOI layer 103 and the substrate layer 101. When the buried insulator 102 is an oxide it is referred to herein as a buried oxide or BOX.

The SOI layer 103 and the substrate layer 101 can include any suitable semiconductor, such as silicon, germanium, silicon germanium, and/or a III-V semiconductor. Preferably, the SOI layer 103 and the substrate layer 101 are both undoped. According to an exemplary embodiment, a different material is used for the SOI layer 103 than for the substrate layer 101, and the particular materials employed for the SOI layer 103 and the substrate layer 101 can vary depending on whether the bottom/top VFETs are NFET/PFET or PFET/NFET. For instance, according to an exemplary embodiment, silicon is used as the channel material for the NFET and silicon germanium is used as the channel material for the PFET. As will become apparent from the description that follows, a portion of the fin patterned in the SOI layer 103 can serve as the vertical fin channel of the top WET in the stack, while a portion of the fin patterned in the substrate layer 101 can serve as the vertical fin channel of the bottom VFET in the stack. Thus, according to this particular example, if the device is configured with the bottom VFET/top VFET as NFET/PFET, then the substrate layer 101 would be Si and the SOI layer 103 would be SiGe. On the other hand, if the device is configured with the bottom VFET/top VFET as PFET/NFET, then the SOI layer 103 would be Si and the substrate layer 101 would be SiGe.

FIGS. 1 through 14 also illustrate A-A' line 300A and B-B' line 300B to depict the locations of additional cross-sectional views of the semiconductor structure 100. The A-A' line 300A can be the location of a cross-sectional view of the semiconductor structure 100 at one end, and the B-B' line 300B can be the location of a cross-sectional view of the semiconductor structure 100 at the opposite end. The AA' cross-section 400A can be the cross-sectional view corresponding to the A-A' line 300A, and the BB' cross-section 400B can be the cross-sectional view corresponding to the B-B' line 300B.

Figure 2:
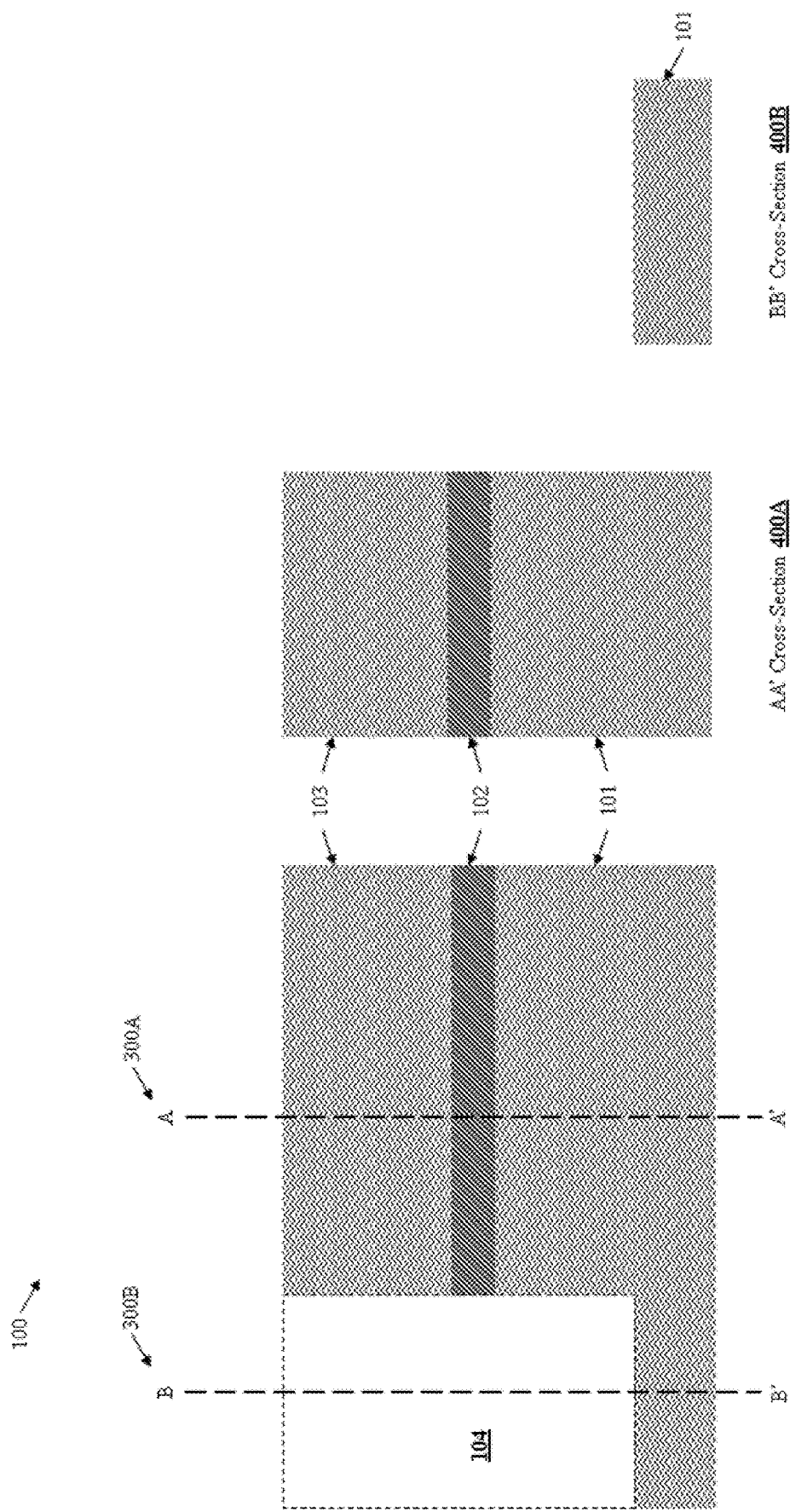
FIG. 2 illustrates an example, non-limiting cross-sectional diagram of a semiconductor structure facilitating self-aligned gate cut on a dielectric fin extension in direct stacked VTFET including a trench in accordance with one or more embodiments described herein.

FIG. 2 illustrates an example, non-limiting cross-sectional diagram of a semiconductor structure 100 including a trench 104 in accordance with one or more embodiments described herein. The trench 104 can be formed by patterning to remove a portion of semiconductor structure 100. Standard lithography and etching techniques can be used to pattern the trench 104. A directional etching process such as reactive ion etching can be suitable for etching the trench 104. The trench 104 can be at one end of the semiconductor structure 100 and extending through the SOI layer 103, the buried insulator 102 and partway through the substrate layer 101 at a determined depth. The BB' cross-section 400B can provide an example of the depth of the substrate layer 101 remaining upon forming the trench 104.

Figure 3:
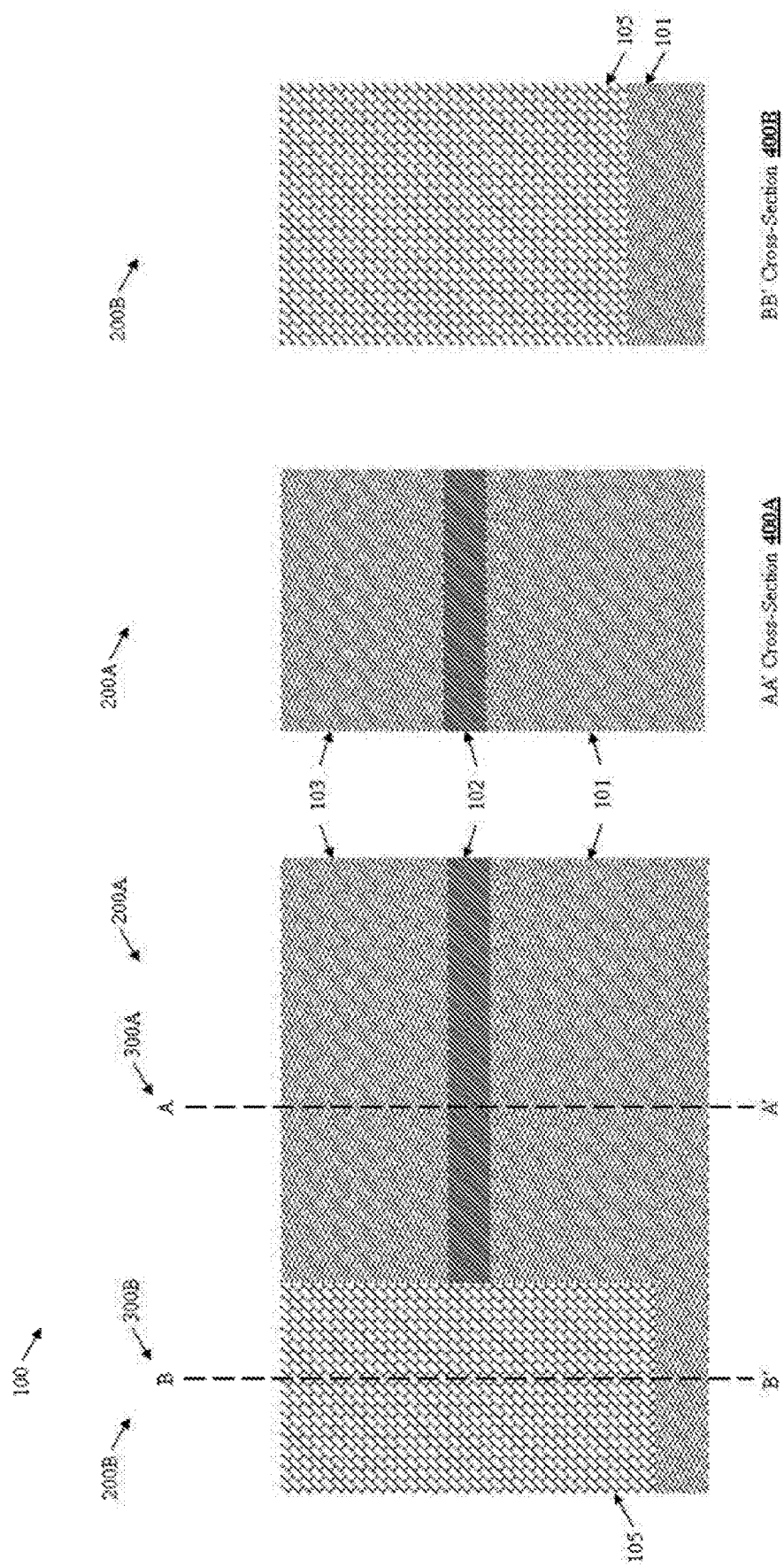
FIG. 3 illustrates an example, non-limiting cross-sectional diagram of a semiconductor structure facilitating self-aligned gate cut on a dielectric fin extension in direct stacked VTFET including a dielectric fill in accordance with one or more embodiments described herein.

FIG. 3 illustrates an example, non-limiting cross-sectional diagram of a semiconductor structure 100 including a dielectric fill 105 (e.g. first dielectric fill) in accordance with one or more embodiments described herein. The dielectric fill 105 can be patterned into the SOI wafer extending through the SOI layer 103, the buried insulator 102 and partway through the substrate layer 101. Example suitable dielectric material for the dielectric fill 105 can be, but not limited to, silicon nitride, carbo-doped silicon oxide also known as organosilicate glass (OSG), silicon-boron carbonitride or silicon oxynitride. The dielectric material can be disposed on the substrate layer 101 to fill the entire space of the trench 104. Chemical vapor deposition (CVD) or plasma enhance chemical vapor deposition (PECVD) can be used to deposit the dielectric material to fill the trench 104. The end of the semiconductor structure 100 deposited with the dielectric fill 105 can be the dielectric fin end 200B. The opposite end of the semiconductor structure 100 can be the semiconductor fin end 200A. The AA' cross-section 400A can provide a cross-sectional view of the semiconductor fin end 200A, and the BB' cross-section 400B can provide a cross-sectional view of the dielectric fin end 200B. As described in greater detail below, the dielectric fill can be used as a dielectric fin extension. For example, the dielectric fill 105 can be used to extend the length of a semiconductor fin to form a hybrid fin 200 comprising a semiconductor fin end 200A and a dielectric fin end 200B. As such, the dielectric fin end 200B can serve to extend the length of the hybrid fin 200 rather than to provide conductivity. Much of the conductivity can be found in regions away from the dielectric fin end 200B and in the semiconductor fin end 200A.

Figure 4:
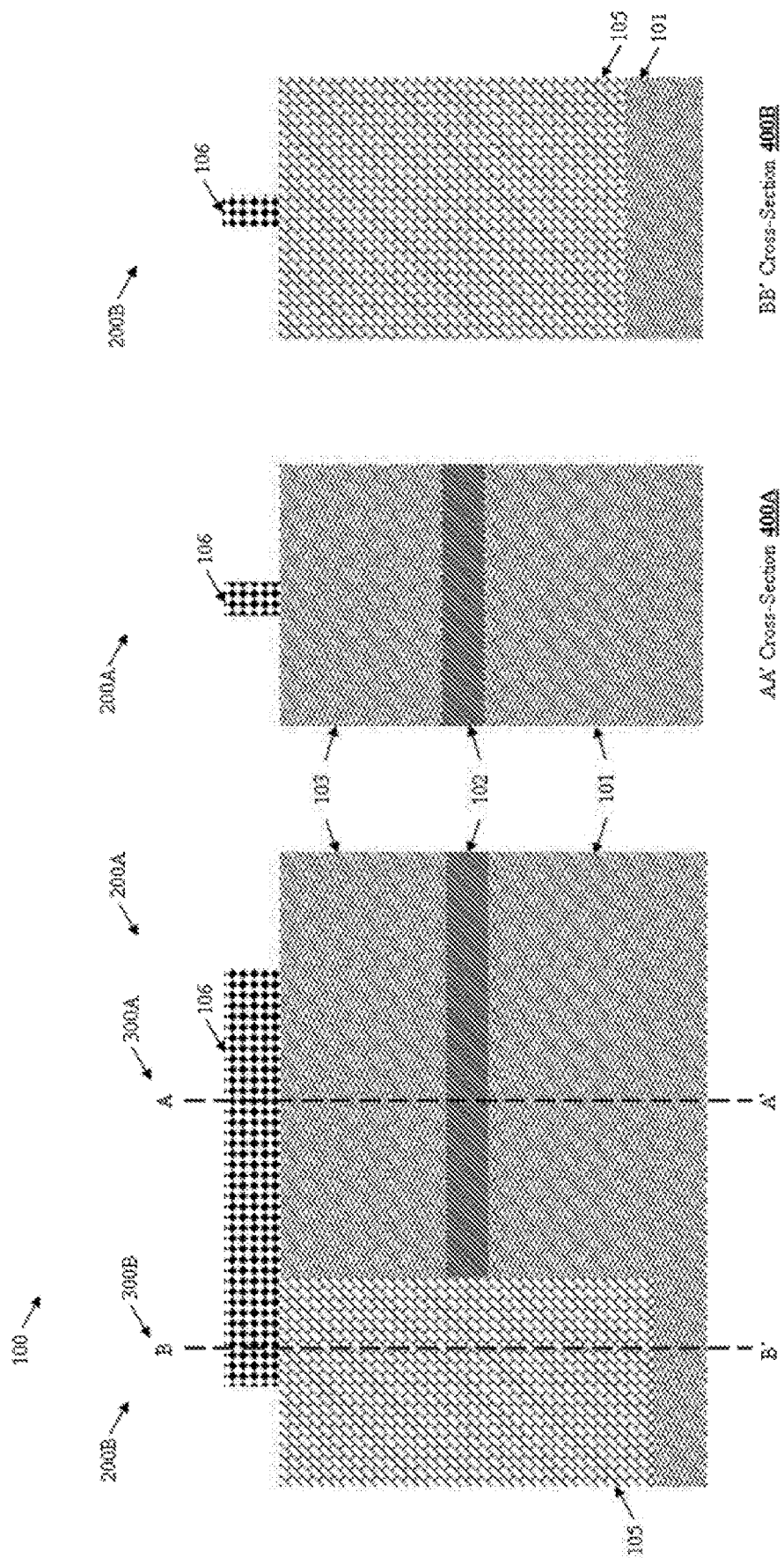
FIG. 4 illustrates an example, non-limiting cross-sectional diagram of a semiconductor structure facilitating self-aligned gate cut on a dielectric fin extension in direct stacked VTFET including a hardmask in accordance with one or more embodiments described herein.

FIG. 4 illustrates an example, non-limiting cross-sectional diagram of a semiconductor structure 100 including a hardmask 106 in accordance with one or more embodiments described herein. Standard lithography and etching techniques can be used to pattern the hardmask 106 on the SOI layer 103. Suitable materials for the hardmask 106 can include, but are not limited to, nitride hardmask materials such as silicon nitride and/or silicon oxynitride. If the dielectric fill 105 is silicon nitride, the hardmask 106 can be a different material to for selectively purposes. The hardmask 106 can also be a combination of materials. For example, the hardmask 106 can comprise a layer of silicon oxide on the top and a layer of silicon nitride on the bottom to form a double layer hardmask. The hardmask 106 can be used to form at least one fin in the substrate layer 101. A directional etching process, such as reactive ion etching, can be used for the fin etch as illustrated in FIG. 5.

Figure 5:
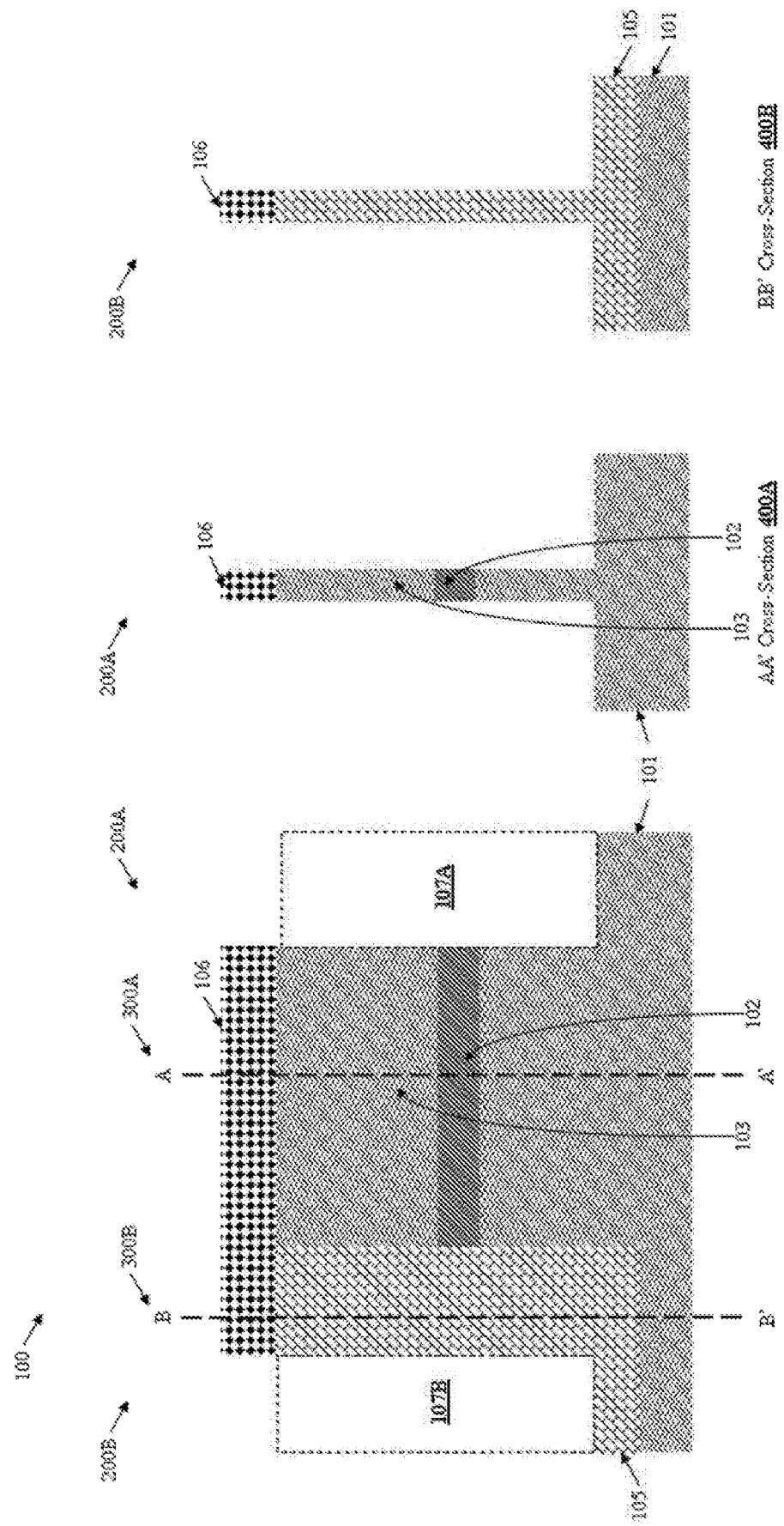
FIG. 5 illustrates an example, non-limiting cross-sectional diagram of a semiconductor structure facilitating self-aligned gate cut on a dielectric fin extension in direct stacked VTFET including a hybrid fin and a bottom source/drain in accordance with one or more embodiments described herein.

FIG. 5 illustrates an example, non-limiting cross-sectional diagram of a semiconductor structure 100 including a hybrid fin 200 (e.g., comprising a semiconductor fin end 200A and a dielectric fin end 200B) and a bottom source/drain (e.g., first source and drain, not shown) in accordance with one or more embodiments described herein. As illustrated in FIG. 5, the semiconductor fin end 200A can extend through the SOI layer 103, through the buried insulator 102 and partway through the substrate layer 101. The dielectric fin end 200B can similarly extend through the SOI layer 103, through the buried insulator 102 and partway through the substrate layer 101. However, after the fin etch, the dielectric fin end 200B can have a layer of the dielectric fill 105 remaining on top of the substrate layer 101 at the base of the dielectric fin end 200B and along the vertical direction of the dielectric fin end 200B. For both the semiconductor fin end 200A and the dielectric fin end 200B, the portion of the hybrid fin 200 patterned in the substrate layer 101 along the vertical direction can serve as the vertical fin channel of the bottom VTFET in the stack, and the portion of the hybrid fin 200 patterned in the SOI layer 103 along the vertical direction can serve as the vertical fin channel of the top VTFET in the stack. For sake of brevity, patterning steps for both ends of the hybrid fin 200 (e.g., the semiconductor fin end 200A and the dielectric fin end 200B) will generally mention the patterning locations/portions on the SOI wafer, e.g., substrate layer 101, buried insulator 102 and SOI layer 103. For sake of brevity, the patterning steps may not mention that at the dielectric fin end 200B, the patterning is on the dielectric fill 105 covering these portions. The dielectric fill 105 can cover the top of the substrate layer 101 at the base of the dielectric fin end 200B and along the vertical direction of the dielectric fin end 200B.

A bottom source/drain (not shown) for the bottom VTFET can be formed at the base of the hybrid fin 200 below the vertical fin channel of the bottom VTFET. The bottom source/drain can be patterned all around the base of the hybrid fin 200. According to an exemplary embodiment, the bottom source/drain can be formed using ion implantation of an n-type or p-type dopant into the substrate layer 101 beneath the hybrid fin 200. The bottom source/drain can also be formed by epitaxial growth of highly doped semiconductors. Suitable n-type dopants can include, but are not limited to, phosphorous and/or arsenic, and suitable p-type dopants can include, but are not limited to, boron. For example, phosphosilicate glass (PSG) can be used as an n-type dopant and borosilicate glass (BSG) can be used as a p-type dopant. The polarity of the dopant (n-type or p-type) for the bottom source/drain varies depending on whether the bottom VTFET is an NFET or PFET. In the case of an NFET, the bottom source/drain can include an n-type dopant. In the case of a PFET, the bottom source/drain can include a p-type dopant.

An annealing process can be used to activate the dopant in the bottom source/drain. According to an exemplary embodiment, the activation anneal can be performed using a process such as rapid thermal annealing (RTA) at a temperature of about 850° C. to about 1000° C., and ranges therebetween.

Figure 6:
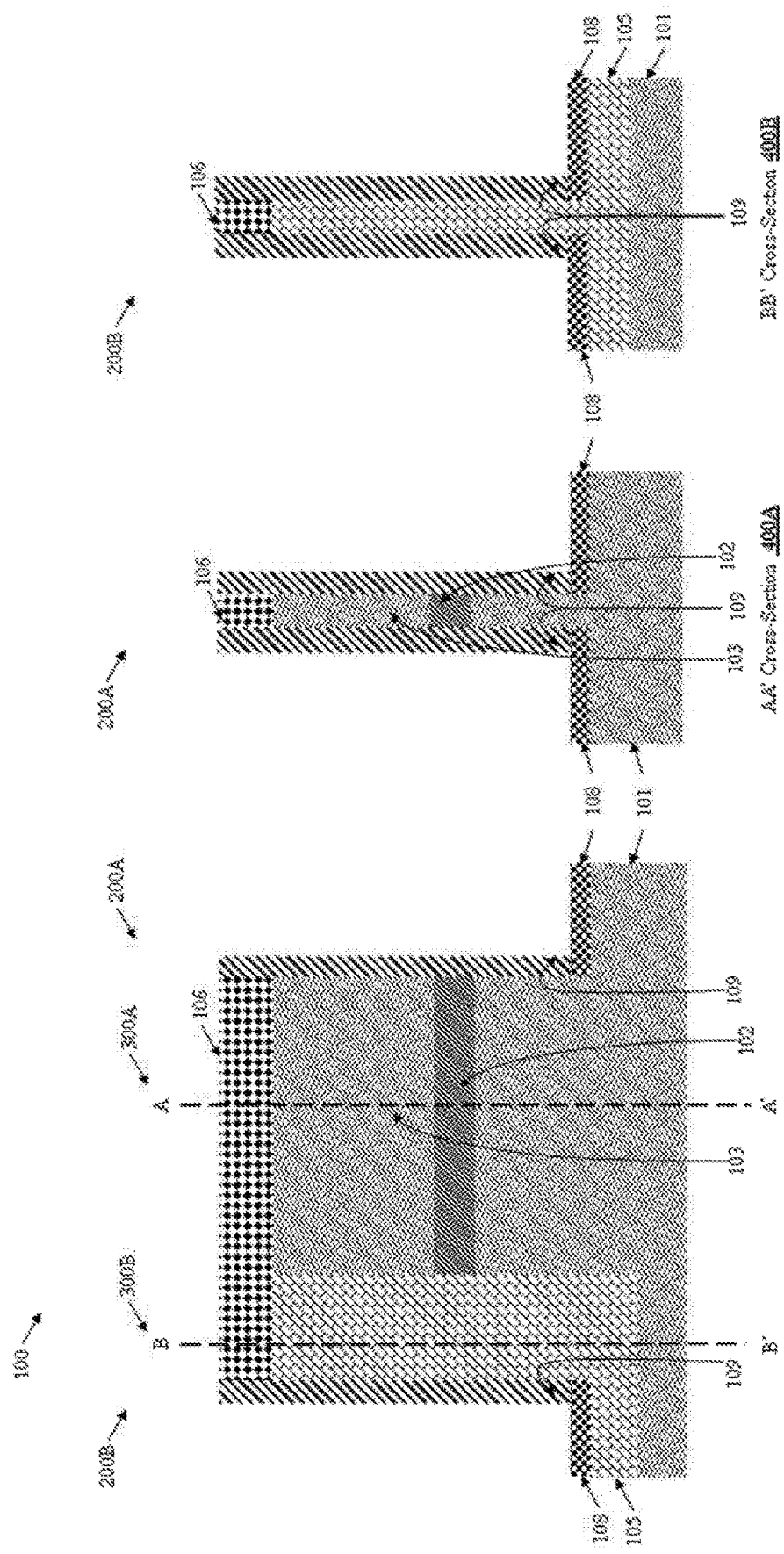
FIG. 6 illustrates an example, non-limiting cross-sectional diagram of a semiconductor structure facilitating self-aligned gate cut on a dielectric fin extension in direct stacked VTFET including a bottom spacer and a gate stack in accordance with one or more embodiments described herein.

FIG. 6 illustrates an example, non-limiting cross-sectional diagram of a semiconductor structure including a bottom spacer 108 (e.g., first spacer) and a gate stack 109 (e.g., first self-aligned gate) in accordance with one or more embodiments described herein. The bottom spacer 108 of the bottom VTFET can be formed on the bottom source/drain. The bottom spacer 108 can be patterned all around the hybrid fin 200. Suitable materials for the bottom spacer 108 can include, but are not limited to, silicon dioxide and/or silicon oxycarbide. According to an exemplary embodiment, the bottom spacer 108 can be formed using a directional deposition process whereby the spacer material can be deposited with a greater amount of the material being deposited on the horizontal surfaces (including on top of the bottom source/drain), as compared to vertical surfaces (such as along the vertical direction or sidewalls of the hybrid fin 200). Thus, when an etch is used on the spacer material, the timing of the etch needed to remove the spacer material from the vertical surfaces can leave the bottom spacer 108 shown in FIG. 6 on the bottom source/drain since a greater amount of the spacer material was deposited on the horizontal surfaces. For example, a high density plasma chemical vapor deposition (HDP CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

The gate stack 109 (e.g., a gate dielectric and gate conductor) of the bottom VTFET can be formed alongside the vertical direction of the hybrid fin 200 and on the bottom spacer 108. The gate stack 109 can comprise of a high-κ dielectric and a workfunction metal (WFM) formed by conformal deposition such as atomic layer deposition (ALD) and directional etch back. Conformal deposition can be used to deposit the gate stack materials on the horizontal surfaces and vertical surfaces of the semiconductor structure 100. To pattern the gate stack 109, a gate dielectric (not shown) can be deposited onto the bottom spacer 108 (e.g., horizontal surfaces) and alongside the vertical direction of the hybrid fin 200 (e.g., vertical surfaces). A gate conductor (not shown) can be deposited onto the gate dielectric on the horizontal surfaces and vertical surfaces.

Directional etch back can be used to remove the gate materials on the horizontal surfaces above the hardmask 106 and the bottom spacer 108 to leave remaining the gate materials or gate stack 109 on the vertical surfaces on top of the bottom spacer 108 as illustrated in FIG. 6. Directional etch back can be used to remove the gate dielectric and gate conductor deposited on the horizontal surfaces. Reactive ion etching can be an example of the type of directional etch back process that can be used to remove or cut the gate materials on the horizontal surfaces to leave remaining the gate materials on the vertical surfaces. The horizontal surfaces of the hardmask 106 and the bottom spacer 108 can be used as a guide for a self-aligned gate cut on the horizontal surfaces. The gate cut process can be self-aligned to the horizontal surfaces of the hardmask 106 and the bottom spacer 108 and that the cutting of the gate material is along (or aligned to) the horizontal surfaces of the hardmask 106 and the bottom spacer 108. Cutting of the gate material from the horizontal surfaces can also cut the gate connection between adjacent fins if there are multiple fins. The separated individual gates can be used to create individual transistors.

According to an exemplary embodiment, a metal gate can be formed wherein the gate conductor is a metal or combination of metals and the gate dielectric is a high-κ dielectric. For instance, the gate conductor is a WFM. The particular WFM employed can vary depending on whether the bottom VFET is an NFET (n-type WFM) or PFET (p-type WFM). Suitable n-type WFMs can include, but are not limited to, titanium nitride, tantalum nitride and/or aluminum-containing alloys such as titanium aluminide, titanium aluminum nitride, titanium aluminum carbide, tantalum aluminide, tantalum aluminum nitride, and/or tantalum aluminum carbide. Suitable p-type WFMs can include, but are not limited to, titanium nitride, tantalum nitride, and tungsten. Titanium nitride and tantalum nitride can be relatively thick (e.g., greater than about 2 nanometers (nm)) when used as p-type WFMs. However, very thin titanium nitride or tantalum nitride layers (e.g., less than about 2 nm) can be used beneath aluminum-containing alloys in n-type WFM stacks to improve electrical properties such as gate leakage currents. Thus, there is some overlap in the exemplary n- and p-type WFMs given above.

The term "high-κ" as used herein can refer to a material having a relative dielectric constant κ which can be much higher than that of silicon dioxide (e.g., a dielectric constant κ=25 for hafnium oxide rather than 4 for silicon dioxide). Suitable high-κ gate dielectrics can include, but are not limited to, hafnium oxide and/or lanthanum oxide.

Figure 7:
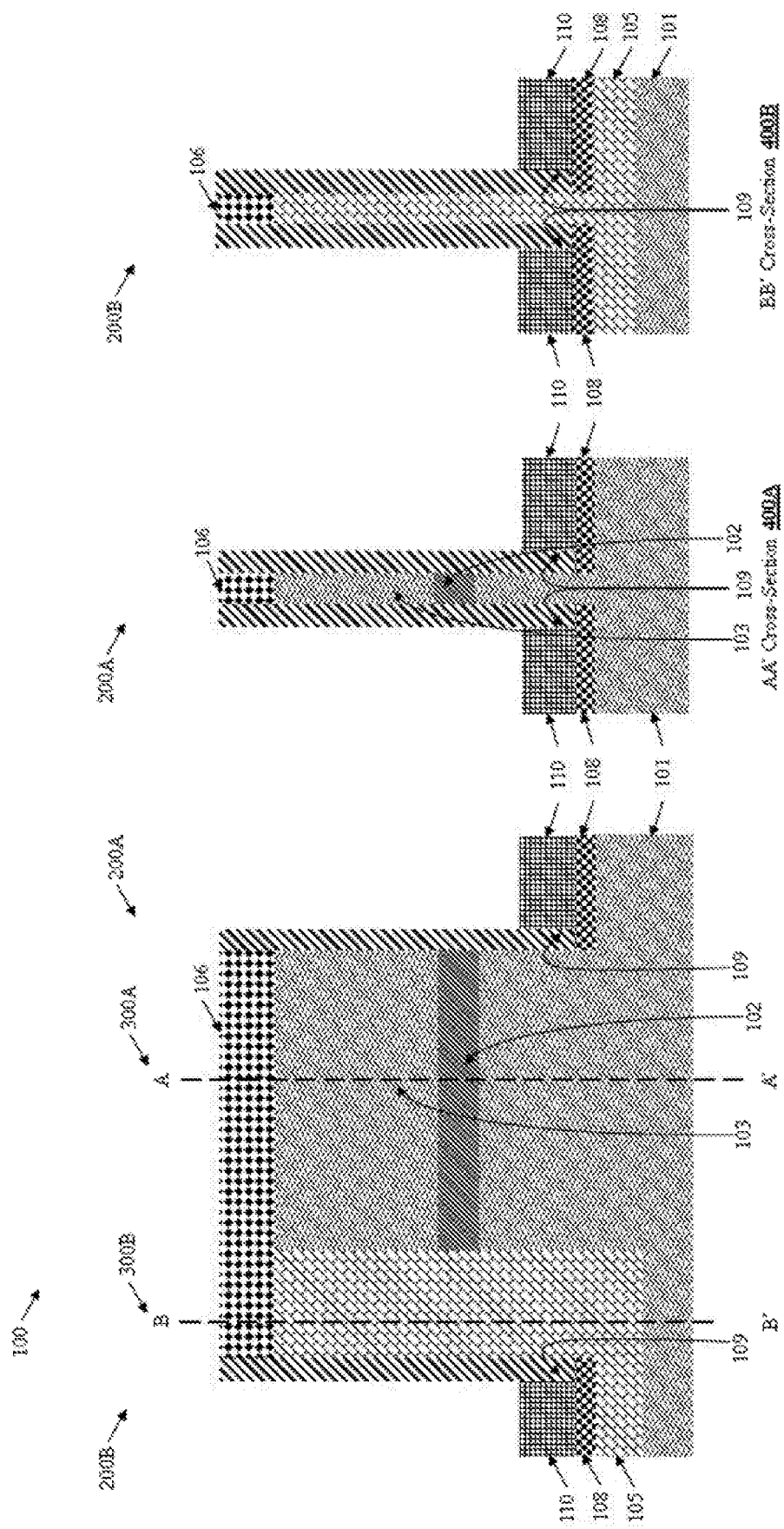
FIG. 7 illustrates an example, non-limiting cross-sectional diagram of a semiconductor structure facilitating self-aligned gate cut on a dielectric fin extension in direct stacked VTFET including an interlayer dielectric in accordance with one or more embodiments described herein.

FIG. 7 illustrates an example, non-limiting cross-sectional diagram of a semiconductor structure 100 including an interlayer dielectric 110 (e.g., first interlayer dielectric) in accordance with one or more embodiments described herein. The interlayer dielectric 110 of the bottom VTFET can be patterned on the bottom spacer 108 all around the hybrid fin 200. The dielectric material can be deposited on the bottom spacer 108 and recessed to a determined depth. Standard lithography and etching techniques can be used to pattern the interlayer dielectric 110 on the bottom spacer 108. A directional etching process, such as reactive ion etching, can be used to pattern the interlayer dielectric 110. The dielectric material for the interlayer dielectric 110 can be a nitride-based material that can be used for isolation purposes. As a non-limiting example, the dielectric nitride-based material that can be used as the interlayer dielectric 110 can contain two materials, a first silicon nitride liner and a second silicon dioxide layer. For example, the interlayer dielectric 110 can be a determined depth (e.g., height), which can be the amount of space or isolation between the bottom spacer 108 and the top spacer (not shown) that is later patterned on top of the interlayer dielectric 110. The determined depth of the interlayer dielectric 110 can also be the determined depth of the gate stack 109 as the interlayer dielectric 110 can be used as a guide for further self-aligned gate cut to etch back the gate stack 109.

Figure 8:
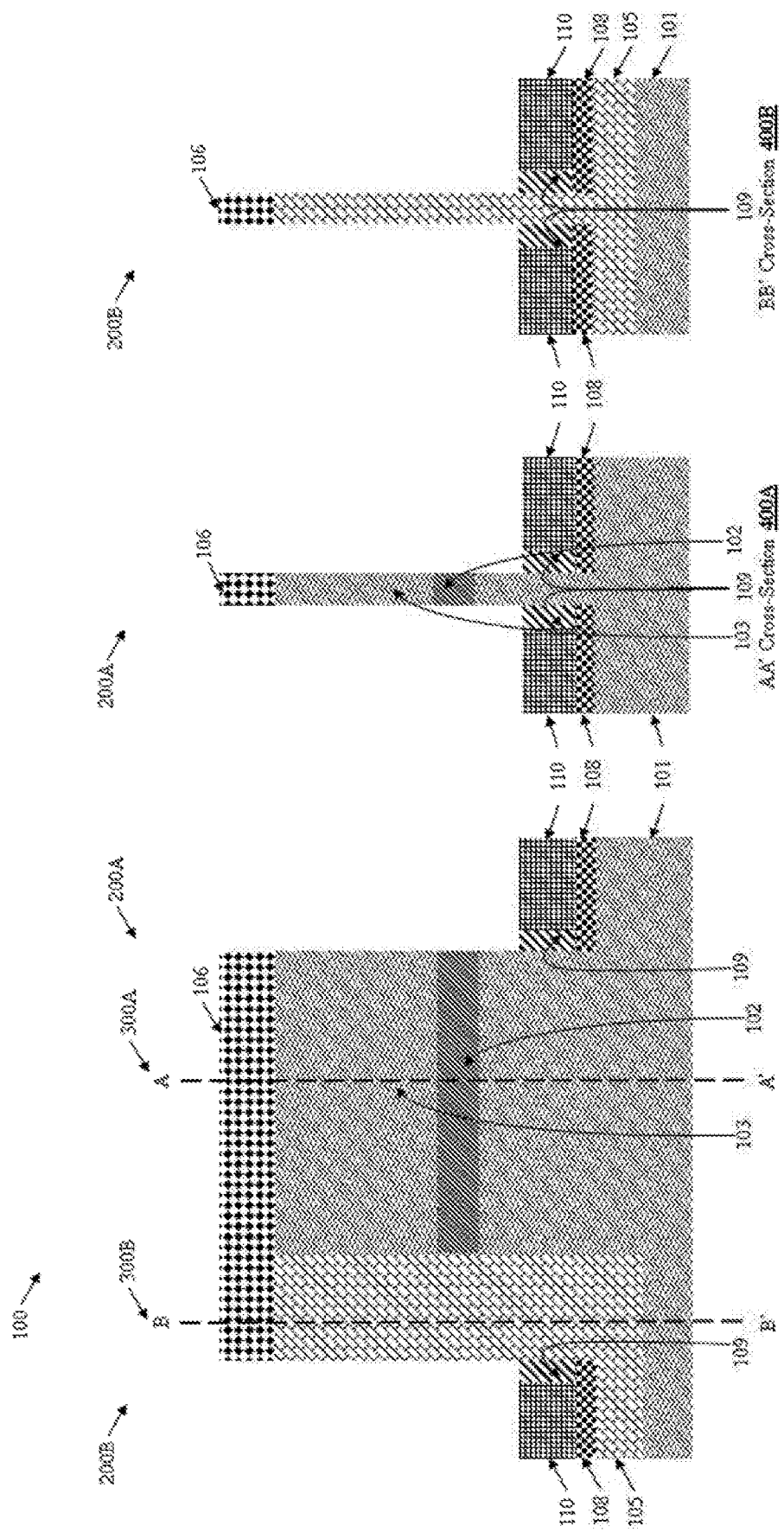
FIG. 8 illustrates an example, non-limiting cross-sectional diagram of a semiconductor structure facilitating self-aligned gate cut on a dielectric fin extension in direct stacked VTFET including an etched back gate stack in accordance with one or more embodiments described herein.

FIG. 8 illustrates an example, non-limiting cross-sectional diagram of a semiconductor structure 100 including an etched back gate stack 109 in accordance with one or more embodiments described herein. Directional etch back can be used to etch back the gate stack 109 for the bottom VTFET. Reactive ion etching can be an example of the type of directional etch back process that can be used to etch back the gate stack 109. The gate stack 109 from FIG. 7 can be etched back to a determined depth aligned with the interlayer dielectric 110. The etching back of the gate stack 109 can be self-aligned with the interlayer dielectric 110 so that the gate cut process can be a self-aligned gate cut. The horizontal surface at the top of the interlayer dielectric 110 can be used as a guide for the self-aligned gate cut in etching back the gate stack 109. That is, the depth or height of the gate stack 109 from FIG. 7 can be etched down to the same depth or height as the interlayer dielectric 110 to leave remaining the gate stack 109 as shown in FIG. 8. The gate cut process can be self-aligned to the horizontal surface of the interlayer dielectric 110 and that the cutting of the gate material is along (or aligned to) the horizontal surface of the interlayer dielectric 110.

Figure 9:
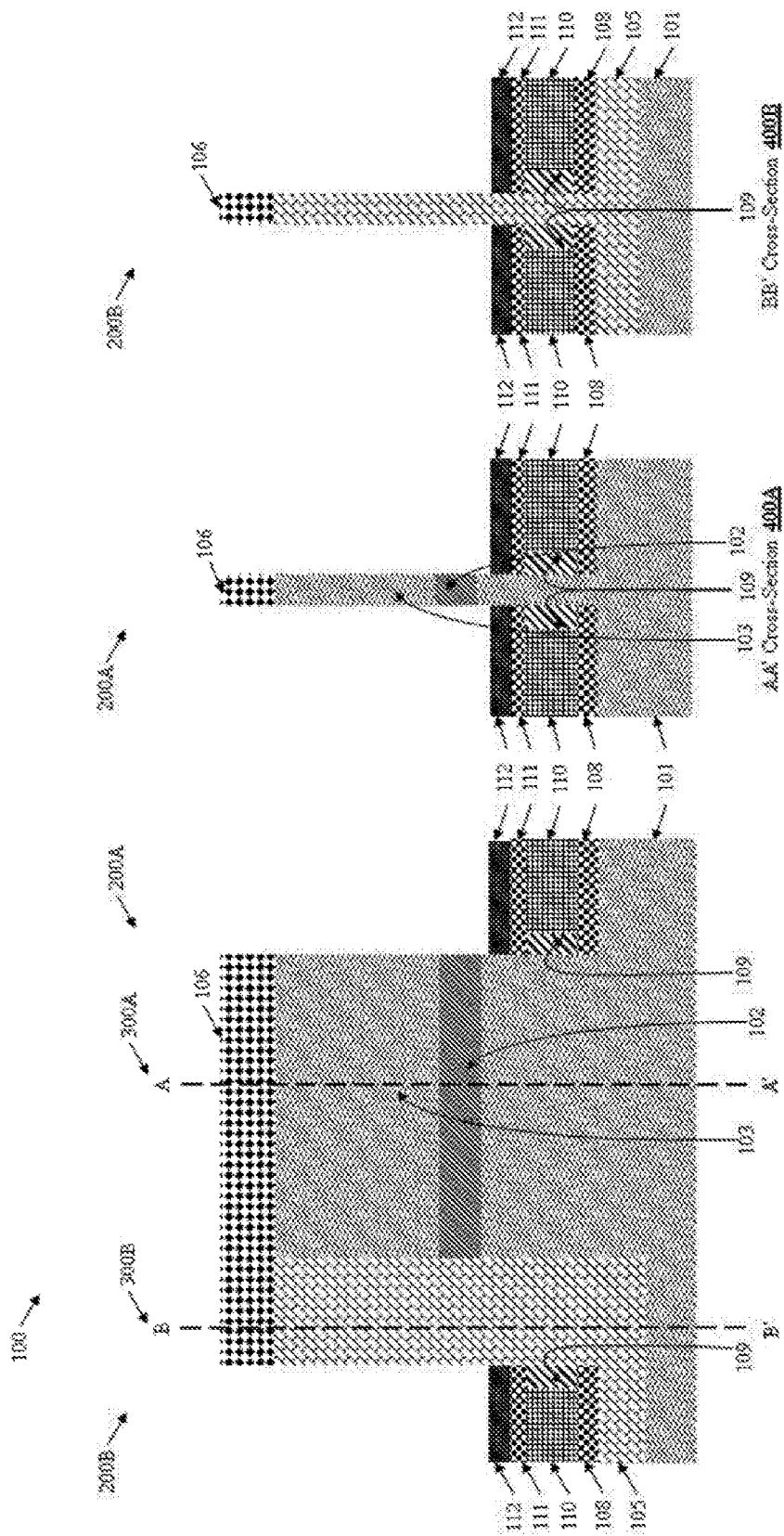
FIG. 9 illustrates an example, non-limiting cross-sectional diagram of a semiconductor structure facilitating self-aligned gate cut on a dielectric fin extension in direct stacked VTFET including a top spacer and a doped layer in accordance with one or more embodiments described herein.

FIG. 9 illustrates an example, non-limiting cross-sectional diagram of a semiconductor structure 100 including a top spacer 111 (e.g., second spacer) and a doped layer 112 (e.g., first doped layer) in accordance with one or more embodiments described herein. The top spacer 111 of the bottom VTFET can be patterned on the gate stack 109 and interlayer dielectric 110 of the bottom VTFET. The top spacer 111 can be patterned all around the hybrid fin 200. Suitable materials for the top spacer 111 can include, but are not limited to, silicon dioxide and/or silicon oxycarbide. The top spacer 111 can also be patterned using a directional deposition process such as HDP CVD or PVD.

As described above, with a directional deposition process a greater amount of the spacer material is deposited on horizontal surfaces, as compared to vertical surfaces (such as along vertical direction or sidewalls of the hybrid fin 200). Thus, when an etch is used on the top spacer material, the timing of the etch needed to remove the top spacer material from the vertical surfaces will leave the top spacers 111 above the gate stack 109 of the bottom WET since a greater amount of the top spacer material was deposited on the horizontal surfaces. For example, an HDP CVD or PVD process can be used for directional film deposition, and an oxide- or nitride-selective (depending on the spacer material) isotropic etch can be used to remove the (thinner) spacer material deposited onto the vertical surfaces.

In order to form a top source/drain (not shown) for the bottom VTFET, a doped layer 112 for the bottom VFET can be deposited onto the top spacers 111 alongside the hybrid fin 200. The doped layer 112 can serve as a dopant source for forming the top source/drain for the bottom VTFET. The particular dopant employed can depend on whether the bottom VTFET is an NFET or PFET. In the case of an NFET, the dopant for the top source/drain can include an n-type dopant. In the case of a PFET, the dopant for the top source/drain can include a p-type dopant.

According to an exemplary embodiment, the dopant sources used can include BSG as the p-type dopant source and PSG as the n-type dopant source. Thus, if the bottom VTFET is an NFET then the doped layer can be formed from PSG, an n-type dopant. If the the bottom VTFET is a PFET then the doped layer is formed from BSG, a p-type dopant. In the same manner as described above, the doped layer 112 can be deposited using a directional deposition process, such as HDP CVD or PVD, with a greater amount of the material (e.g., BSG or PSG) being deposited onto the horizontal surfaces, followed by an etch to remove the material from vertical surfaces resulting in formation of the doped layer 112.

Figure 10:
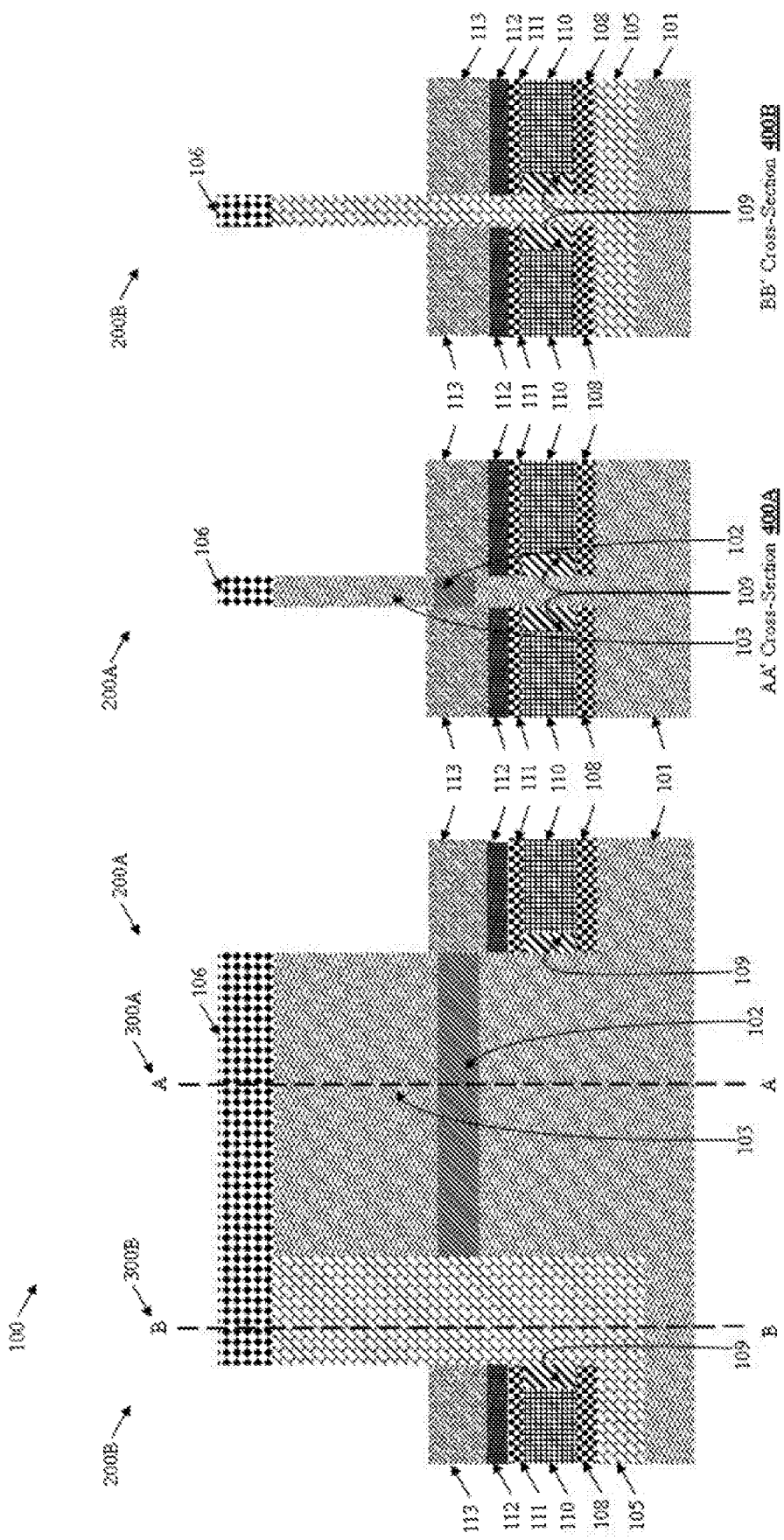
FIG. 10 illustrates an example, non-limiting cross-sectional diagram of a semiconductor structure facilitating self-aligned gate cut on a dielectric fin extension in direct stacked VTFET including an isolation spacer to isolate the bottom VTFET and the top VTFET in accordance with one or more embodiments described herein.

FIG. 10 illustrates an example, non-limiting cross-sectional diagram of a semiconductor structure 100 including an isolation spacer 113 to isolate the bottom VTFET and the top VTFET (to be patterned as described below) in accordance with one or more embodiments described herein. An isolation spacer 113 can be patterned above the doped layer 112 of the bottom VTFET all around the hybrid fin 200. Specifically, the isolation spacer 113 can be formed alongside the buried insulator 102. The isolation spacer 113 can separate the doped layer 112 of the bottom VTFET from the bottom doped layer 115 of the top VTFET (to be patterned as described below in FIG. 11), which like the doped layer 112 can contain an n-type or p-type dopant. Thus, the isolation spacer 113 can isolate these n-type and/or p-type doped layers from one another. Suitable materials for the isolation spacer can include, but are not limited to, dielectric materials such as silicon nitride and/or silicon oxynitride.

Figure 11:
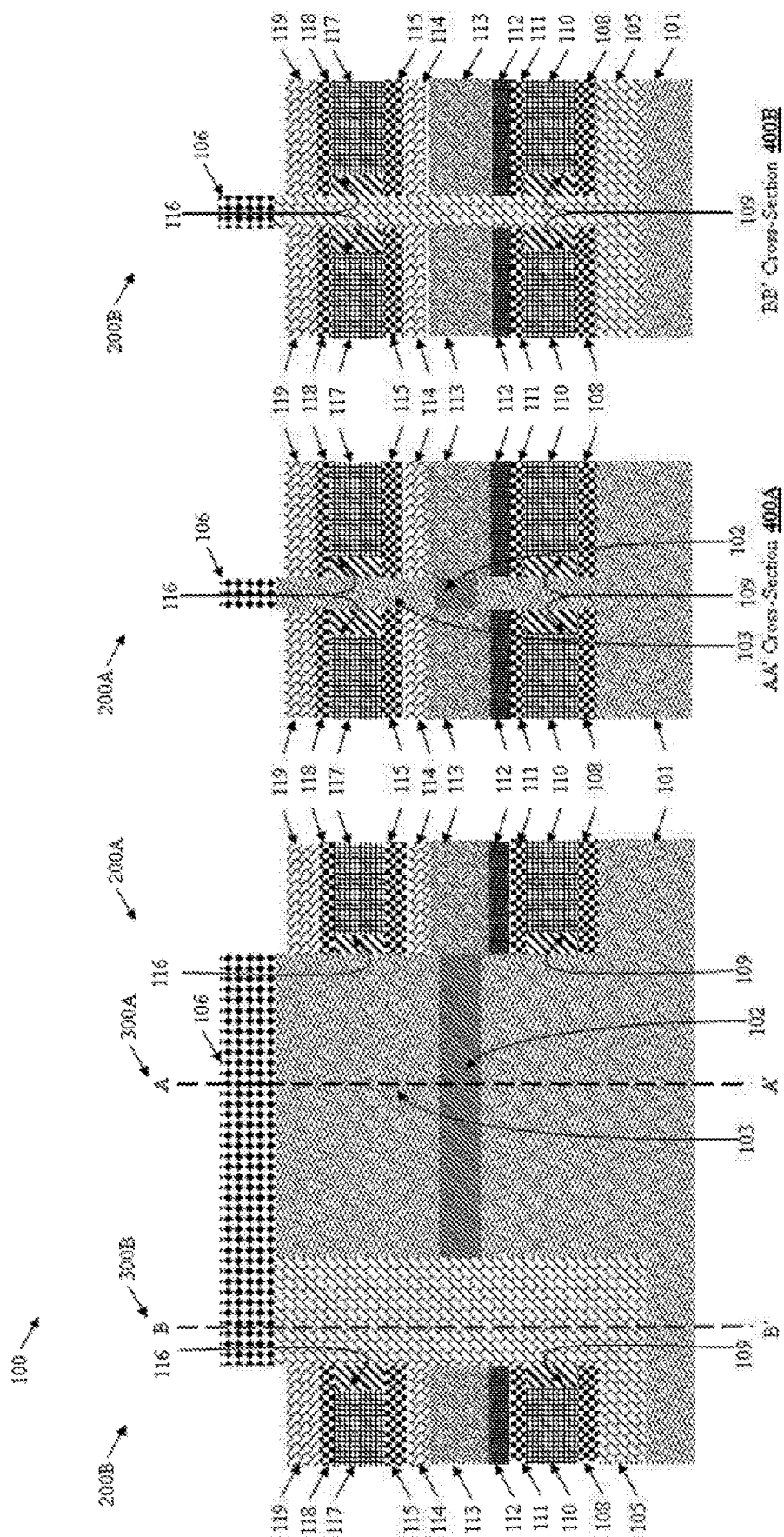
FIG. 11 illustrates an example, non-limiting cross-sectional diagram of a semiconductor structure facilitating self-aligned gate cut on a dielectric fin extension in direct stacked VTFET including a top VTFET in accordance with one or more embodiments described herein.

FIG. 11 illustrates an example, non-limiting cross-sectional diagram of a semiconductor structure including a top VTFET in accordance with one or more embodiments described herein. FIG. 11 illustrates a top VTFET comprising a bottom doped layer 114 (e.g., second doped layer), bottom spacer 115 (e.g., third spacer), gate stack 116 (e.g., second self-aligned gate), interlayer dielectric 117 (e.g., second interlayer dielectric), top spacer 118 (e.g., fourth spacer) and top doped layer 119 (e.g., third doped layer). A top VTFET can be formed over the bottom VTFET. Formation of the top VTFET can proceed in the same general manner as with the bottom VTFET, however, with a device of the opposite polarity being formed. If the bottom VTFET is an NFET, then a PFET can be formed as the top VTFET. If the bottom VTFET is a PFET, then an NFET can be formed as the top VTFET.

One difference in the formation of the top VTFET can be that the doped layers (e.g., BSG or PSG) can be used at the bottom and top of the device to form both the bottom source/drain and top source/drain. By comparison, the bottom VTFET can employ a different doping process such as ion implantation followed by an activation anneal for the bottom source/drain.

As shown in FIG. 11 the bottom doped layer 114 of the top VTFET can be deposited onto the isolation spacer 113 alongside the hybrid fin 200. As with the bottom VTFET, the bottom doped layer 114 of the top VTFET can serve as a dopant source for forming the bottom source/drain for the top VTFET. The particular dopant employed can depend on whether the top VTFET is an NFET or PFET. In the case of an NFET, the dopant for the bottom source/drain can include an n-type dopant. In the case of a PFET, the dopant for the top source/drain can include a p-type dopant.

According to an exemplary embodiment, when the top VTFET is an NFET, the bottom doped layer 114 can be formed from PSG, an n-type dopant. When the top VTFET is a PFET, the bottom doped layer 114 can be formed from BSG, a p-type dopant. In the same manner as described above, the bottom doped layer 114 can be deposited using a directional deposition process, such as HDP CVD or PVD, with a greater amount of the material (e.g., BSG or PSG) being deposited onto horizontal surfaces, followed by an etch to remove the material from vertical surfaces resulting in formation of the bottom doped layer 114.

The bottom spacer 115 of the top VTFET can be formed on the bottom doped layer 114. The bottom spacer 115 can be patterned all around the hybrid fin 200. Suitable materials for the bottom spacer 115 can include, but are not limited to, silicon dioxide and/or silicon oxycarbide. In the same manner as described above, the bottom spacer 115 can be deposited using a directional deposition process, such as HDP CVD or PVD, with a greater amount of the spacer material being deposited onto horizontal surfaces, followed by an etch to remove the material from vertical surfaces resulting in formation of the bottom spacer 115.

The gate stack 116 (e.g., a gate dielectric and gate conductor) of the top VTFET can be formed alongside the vertical direction of the hybrid fin 200 and on the bottom spacer 115. To form the gate, a conformal deposition such as ALD can be used to deposit gate materials on the horizontal surfaces and vertical surfaces of the semiconductor structure 100. A gate dielectric (not shown) can be deposited on horizontal and vertical surfaces of the semiconductor structure 100. A gate conductor (not shown) can be deposited onto the gate dielectric. Directional etch back can be used to remove the gate materials on the horizontal surfaces above the hardmask 106 and the bottom spacer 115 to leave remaining the gate materials or gate stack 116 on the vertical surfaces on top of the bottom spacer 115. Directional etch back can be used to remove the gate dielectric and gate conductor deposited on the horizontal surfaces. Reactive ion etching can be an example of the type of directional etch back process that can be used to remove or cut the gate materials on the horizontal surfaces to leave remaining the gate materials on the vertical surfaces. The horizontal surfaces of the hardmask 106 and the bottom spacer 115 can be used as a guide for a self-aligned gate cut on the horizontal surfaces. The gate cut process can be self-aligned to the horizontal surfaces of the hardmask 106 and the bottom spacer 115 and that the cutting of the gate material is along (or aligned to) the horizontal surfaces of the hardmask 106 and the bottom spacer 115.

According to an exemplary embodiment, a metal gate can be formed wherein the gate conductor can be a metal or combination of metals and the gate dielectric 506 can be a high-κ dielectric. For instance, the gate conductor is a WFM. The particular WFM employed can vary depending on whether the top VTFET is an NFET (n-type WFM) or PFET (p-type WFM). As provided above, suitable n-type WFMs can include, but are not limited to, titanium nitride, tantalum nitride and/or aluminum-containing alloys such as titanium aluminide, titanium aluminum nitride, titanium aluminum carbide, tantalum aluminide, tantalum aluminum nitride, and/or tantalum aluminum carbide. Suitable p-type WFMs can include, but are not limited to, titanium nitride, tantalum nitride, and tungsten. Suitable high-κ gate dielectrics can include, but are not limited to, hafnium oxide and/or lanthanum oxide.

The interlayer dielectric 117 of the top VTFET can be patterned on the bottom spacer 115 all around the hybrid fin 200. The dielectric material can be deposited on the bottom spacer 115 then and recessed to a determined depth. Stand lithography and etching techniques can be used to pattern the interlayer dielectric 117 on the bottom spacer 115. A directional etching process, such as reactive ion etching, can be used to pattern the interlayer dielectric 117. The dielectric material for the interlayer dielectric 117 can be a nitride-based material that can be used for isolation purposes. For example, the interlayer dielectric 110 can be a determined depth (e.g., height), which can be the amount of space or isolation between the bottom spacer 115 and the top spacer 118 that can be patterned on top of the interlayer dielectric 117. The determined depth of the interlayer dielectric 117 can also be the determined depth of the gate stack 116 as the interlayer dielectric 117 can be used as a guide for further self-aligned gate cut to etch back the gate stack 116.

Directional etch back can be used to etch back the gate stack 116 for the top VTFET. Reactive ion etching can be an example of the type of directional etch back process that can be used to etch back the gate stack 116. The gate stack 116 can be etched back to a determined depth aligned with the interlayer dielectric 117. The etching back of the gate stack 116 can be self-aligned with the interlayer dielectric 117 so that the gate cut process can be a self-aligned gate cut. The horizontal surface at the top of the interlayer dielectric 117 can be used as a guide for the self-aligned gate cut in etching back the gate stack 116. That is, the depth or height of the gate stack 116 can be etched down to the same depth or height as the interlayer dielectric 117 to leave remaining the gate stack 116 as shown in FIG. 11. The gate cut process can be self-aligned to the horizontal surface of the interlayer dielectric 117 and that the cutting of the gate material is along (or aligned to) the horizontal surface of the interlayer dielectric 117.

The top spacer 118 of the top VTFET can be patterned on the gate stack 116 and interlayer dielectric 117. The top spacer 118 can be patterned all around the hybrid fin 200. Suitable materials for the top spacer 118 can include, but are not limited to, silicon dioxide and/or silicon oxycarbide. In the same manner as described above, the top spacer 118 can also be deposited using a directional deposition process, such as HDP CVD or PVD, with a greater amount of the spacer material being deposited onto horizontal surfaces, followed by an etch to remove the material from vertical surfaces resulting in formation of the top spacer 118.

The top source/drain for the top VTFET can be formed on the top spacer 118. The top source/drain can be formed by depositing the top doped layer 119 onto the top spacer 118 of the top VTFET. As described above, the top doped layer 119 can serve both as a dopant source for forming the top source/drain for the top VTFET. The particular dopant employed can depend on whether the top VTFET is an NFET or PFET. In the case of an NFET, the top source/drain can include an n-type dopant, and in the case of a PFET, the top source/drain can include a p-type dopant.

A drive-in anneal can be used to drive the dopants from the doped layer 112 into the hybrid fin 200 above the vertical fin channel of the bottom VTFET, the bottom doped layer 114 into the hybrid fin 200 below the vertical fin channel of the top VTFET and the top doped 119 into the hybrid fin 200 above the vertical fin channel of the top. This dopant drive-in can form the top source/drain 112 of the bottom VTFET and the bottom and top source/drain 114 and 119, respectively, of the top VTFET. As provided above, the dopants for the source/drain can depend on whether an NFET (an n-type dopant) or a PFET (a p-type dopant) is being formed. The vertical fin channel (of substrate layer 101) can be present between the bottom source/drain and the top source/drain of the bottom VTFET, and the vertical fin channel (of the SOI layer 103) can be present between the bottom source/drain and the top source/drain of the top VTFET. The vertical fin channel of the bottom VTFET can be separated from the vertical fin channel of the top VTFET by the buried insulator 102.

Figure 12:
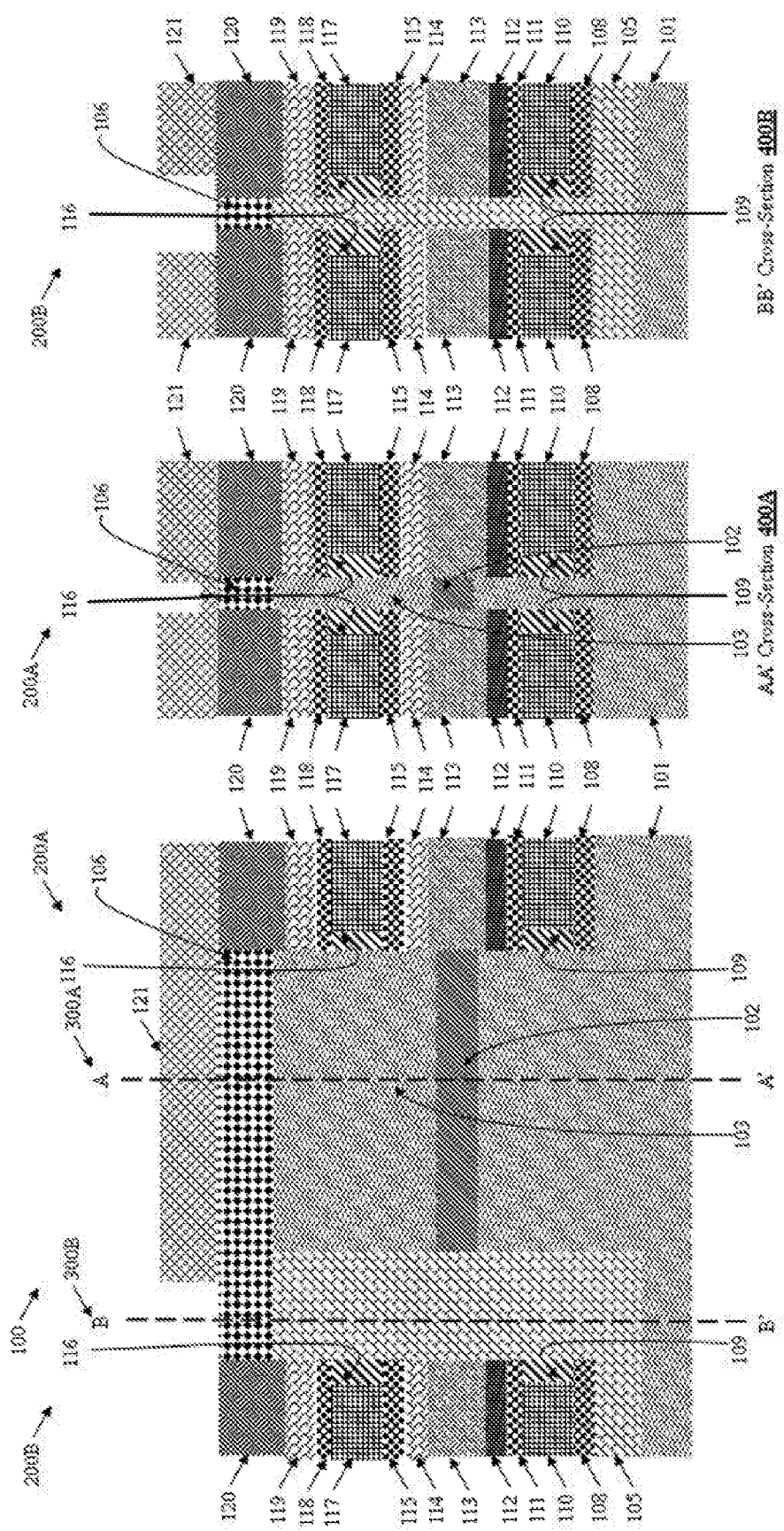
FIG. 12 illustrates an example, non-limiting cross-sectional diagram of a semiconductor structure facilitating self-aligned gate cut on a dielectric fin extension in direct stacked VTFET including a dielectric fill and a gate contact mask in accordance with one or more embodiments described herein.

FIG. 12 illustrates an example, non-limiting cross-sectional diagram of a semiconductor structure including a dielectric fill 120 (e.g., second dielectric fill) and a gate contact mask 121 in accordance with one or more embodiments described herein. The dielectric fill 120 can be deposited on top of the top doped layer 119 of the top VTFET alongside the hardmask 106. Methods of deposition can be, but not limited to, CVD or PECVD. The dielectric fill can serve to isolate the top source/drain 119 of the top VTFET from exposure. The dielectric fill 120 can be formed to a thickness so that the top horizontal surface of the dielectric fill 120 can be leveled the top horizontal surface of the hardmask 106. It is appreciated that the dielectric fill 120 does not have to be horizontally leveled, or flushed, with the hardmask 106. Suitable material for the dielectric fill 120 can be silicon dioxide. The gate contact mask 121 can be an optical planarization layer (OPL), a soft organic material that can be used for the lithography process to form a contact trench 122 as described below.

The gate contact mask 121 can be deposited on top of the hardmask 106 without need to be precisely aligned to the semiconductor fin end 200A. Spin coating can be a non-limiting example method of depositing the gate contact mask 121. The contact mask 121 can be deposited to cover the semiconductor fin end 200A towards the dielectric fin end 200B. The contact mask 121 can cover over part of the dielectric fill 105 by a determined length and not covering the entire gate stacks 109 or 116 as illustrated in FIG. 12.

Figure 13:
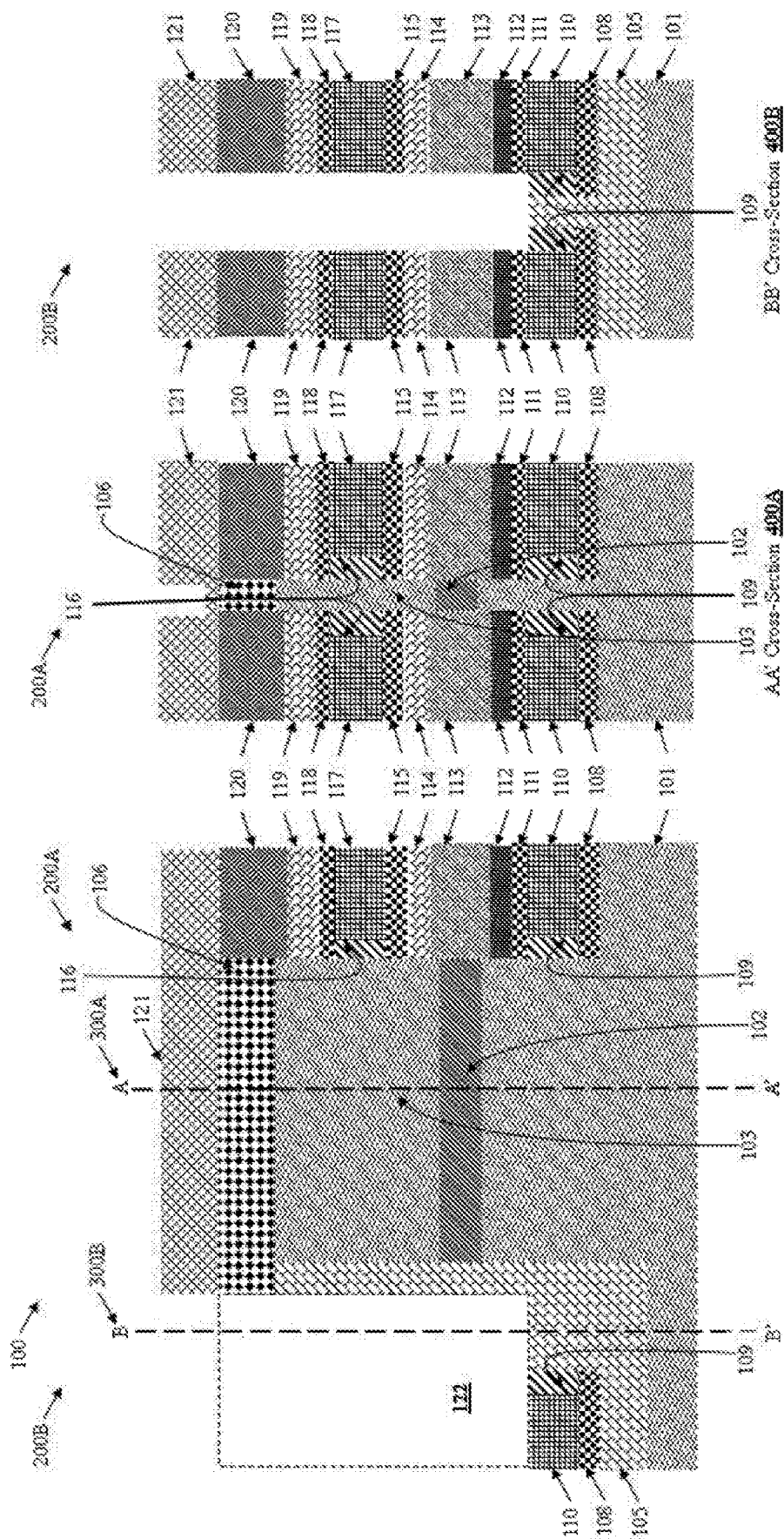
FIG. 13 illustrates an example, non-limiting cross-sectional diagram of a semiconductor structure facilitating self-aligned gate cut on a dielectric fin extension in direct stacked VTFET including a contact trench in accordance with one or more embodiments described herein.

FIG. 13 illustrates an example, non-limiting cross-sectional diagram of a semiconductor structure 100 including a contact trench 122 in accordance with one or more embodiments described herein. The contact mask 121 can be used to etch the contract trench 122. Standard lithography and etching techniques can be used to pattern the contact trench 122 extending through the dielectric fill 120, top doped layer 119, top spacer 118, interlayer dielectric 117, gate stack 115, bottom spacer 115, bottom doped layer 114, isolation spacer 113, top doped layer 112, top spacer 111, stopping at the interlayer dielectric 110. A directional etching process such as reactive ion etching can be suitable for etching the contact trench 122.

As illustrated in FIG. 13, the contact trench 122 can be etched to leave remaining the dielectric fill 105 along the vertical direction and at the bottom of the contract trench 122. The contact trench 122 can extend down through the gate stacks 109 and 116 and stopping at the interlayer dielectric 110. As illustrated below, a gate contact 123 can be deposited to fill the contact trench 122 to contact the gate stacks 109 and 116 and extend the gate stacks 109 and 116 to the end of the dielectric fin end 200B.

Figure 14:
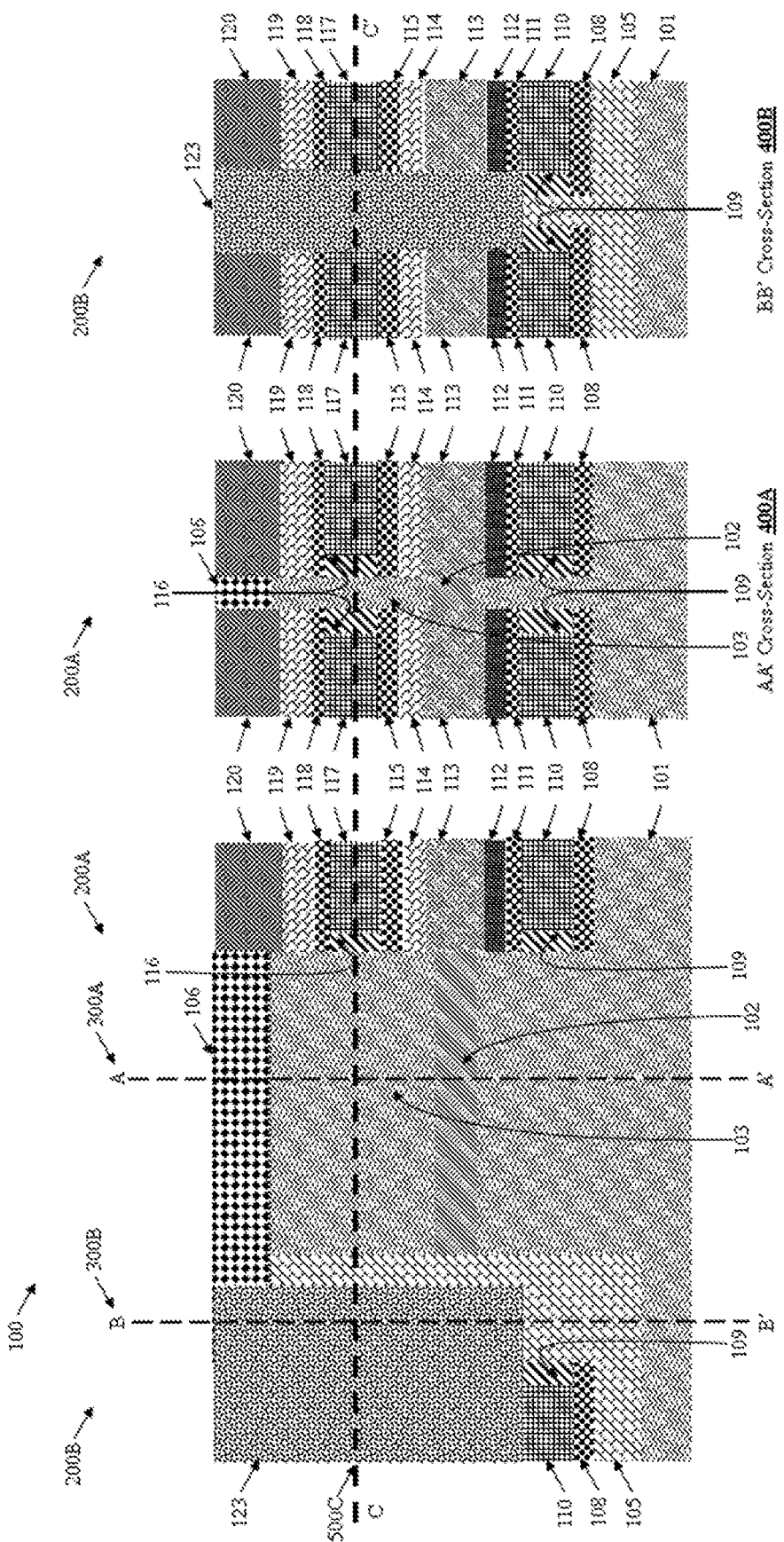
FIG. 14 illustrates an example, non-limiting cross-sectional diagram of a semiconductor structure facilitating self-aligned gate cut on a dielectric fin extension in direct stacked VTFET including a gate contact in accordance with one or more embodiments described herein.

FIG. 14 illustrates an example, non-limiting cross-sectional diagram of a semiconductor structure including a gate contact 123 in accordance with one or more embodiments described herein. The contact mask 121 can be removed, by using a solvent, for example, prior to filling the contact trench 122 with contact metal. A contact metal can be used to fill the contact trench 122 to form the gate contact 123 down to the top source/drain of the bottom VTFET. The gate contact 123 can access the top source/drain of the bottom VTFET. As illustrated in FIG. 14 and further in FIG. 15, the gate contact 123 can contact the gate stacks 109 and 116 and extend the gate stacks 109 and 116 to the end of the dielectric fin end 200B.

Suitable contact metals can be deposited in the contact trench 122 to form the gate contact 123. Suitable contact metals can include, but are not limited to, copper, nickel, platinum and or tungsten. Example deposition methods can be, but not limited to, PVD or CVD.

FIG. 14 also illustrates C-C' line 500C to depict the location of additional cross-sectional view of the semiconductor structure 100. The C-C' line 500C can be the location of a cross-sectional view across the top VTFET or hybrid fin 200 of the semiconductor structure 100. The C-C' line 500C can be horizontal to, and between, the bottom spacer 115 and the top spacer 118 of the top VTFET. The cross-sectional view corresponding to the C-C' line 500C can be the CC' cross-section 600C in FIG. 15.

Figure 15:
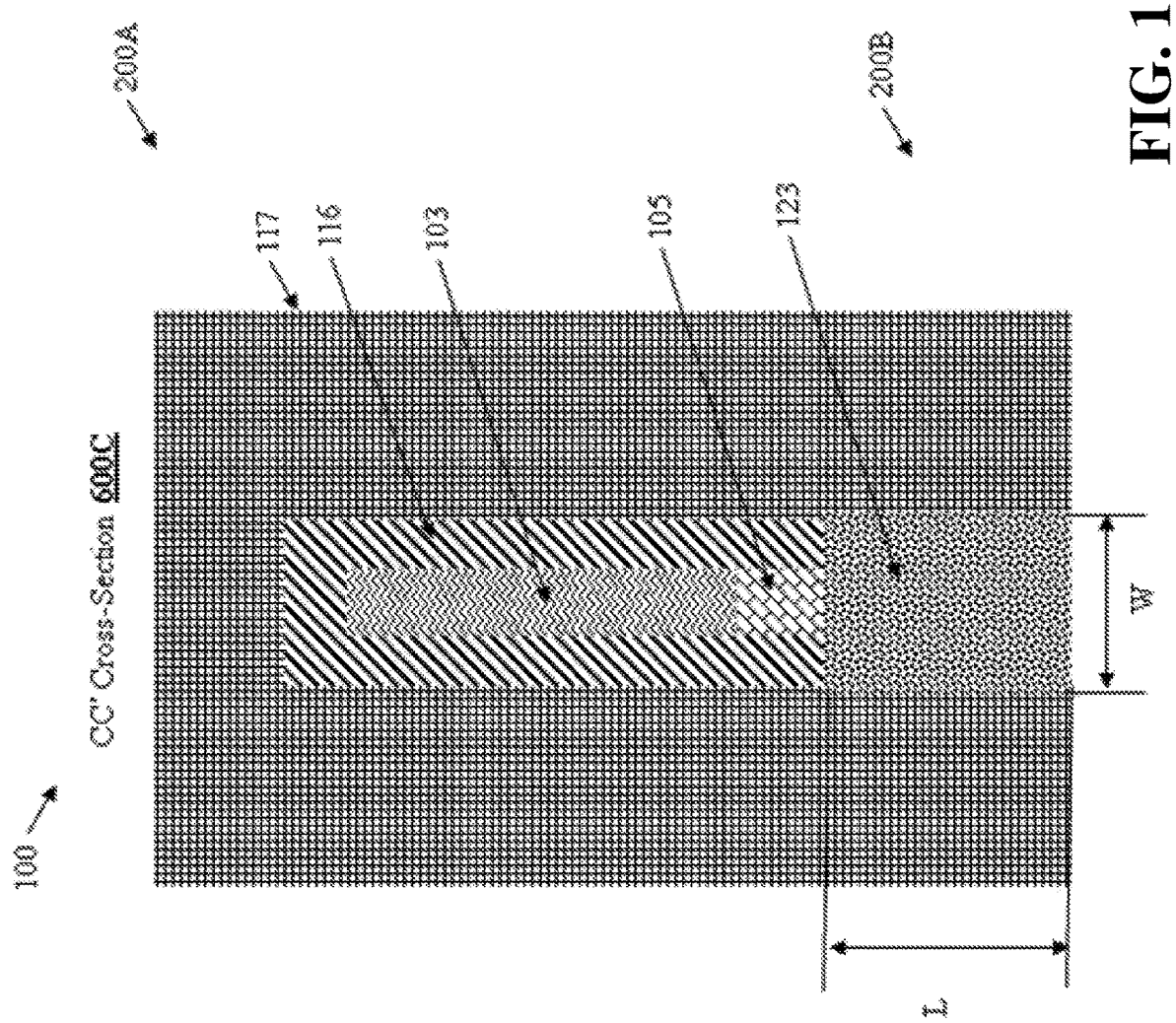
FIG. 15 illustrates an example, non-limiting top-down view cross-sectional diagram of a semiconductor structure facilitating self-aligned gate cut on a dielectric fin extension in direct stacked VTFET illustrating how the gate contact is connected to the gate stack of the top VTFET in accordance with one or more embodiments described herein.

FIG. 15 illustrates an example, non-limiting top-down view cross-sectional diagram of a semiconductor structure 100 illustrating how the gate contact 123 is connected to the gate stack 116 of the top VTFET in accordance with one or more embodiments described herein. The CC' cross-section 600 can be a horizontal, cross-sectional view (e.g., top-down view) of the gate stack 116 and interlayer dielectric 117 of the top VTFET. As illustrated in FIG. 15, the SOI layer 103 can run along the innermost portion of the hybrid fin 200 at one end and make up the semiconductor fin end 200A. The dielectric fill 105 can be connected to the SOI layer 103. The dielectric fill 105 can be at the opposite end of the hybrid fin 200 and make up the dielectric fin end 200B. The SOI layer 103 and the dielectric fill 105 can be the same width. The gate stack 116 can enclose the dielectric fill 105 and the SOI layer 103 on three sides leaving unenclosed the side on the dielectric fill 105 opposite the SOI layer 103. The gate contact 116 and the dielectric fill 105 can extend towards the dielectric fin end 200B and ending length L from the end of the dielectric fin end 200B. The gate contact 123 can connect the gate stack 116 and the dielectric fill 105 on the unenclosed side of the dielectric fill 105 and extend at a length of length L to the end of the dielectric fin end 200B. The width W of the gate contact 123 can be the same as the total width of the dielectric fill 105 and the gate stack 105 on the unenclosed side of the dielectric fill 105. The interlayer dielectric 117 can enclose the gate contact 123 and the gate stack 116 on three sides leaving unenclosed the side on the gate contact 123 opposite the side that is connected to the dielectric fill 105.

Figure 16:
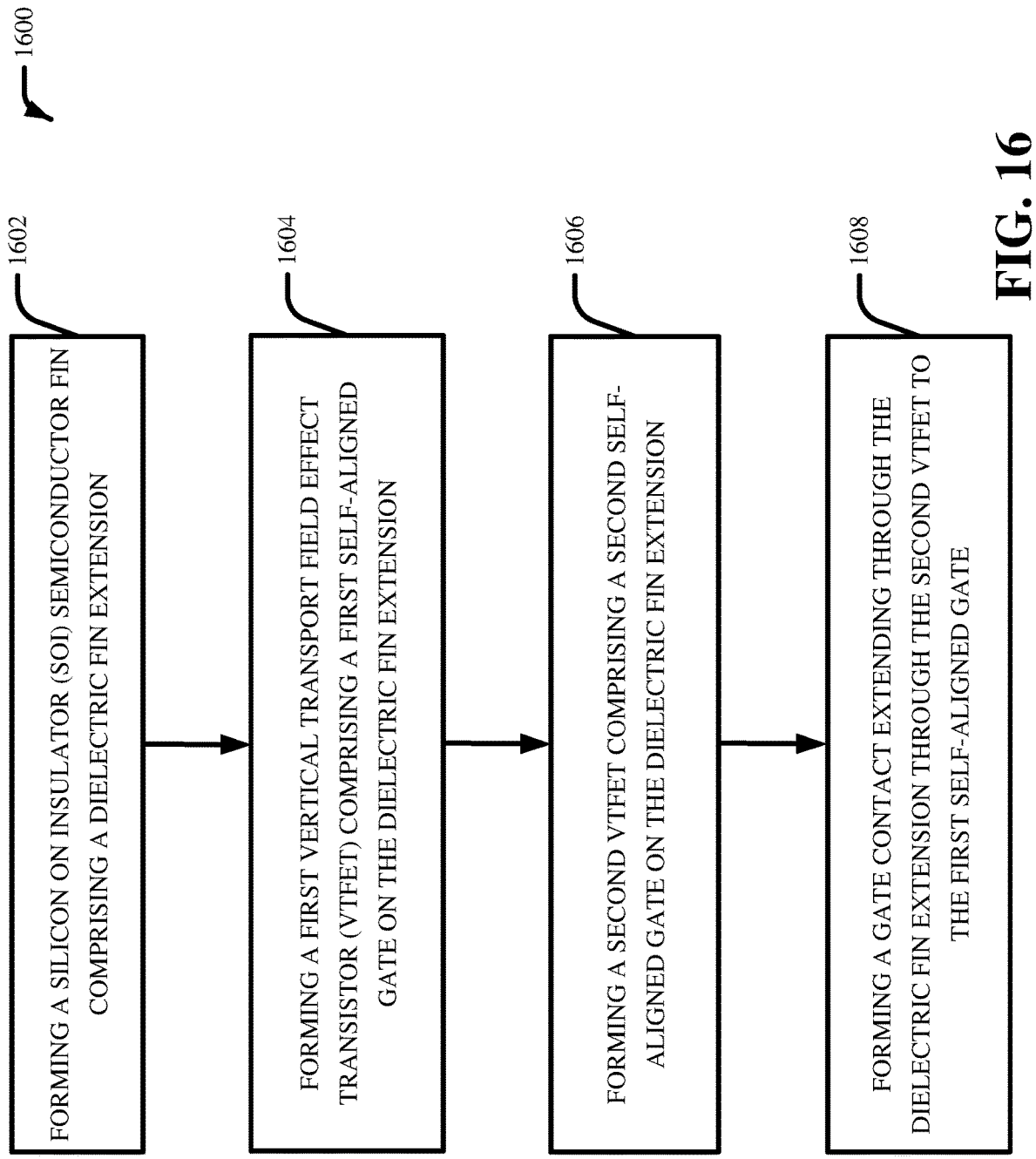
FIG. 16 illustrates an example, non-limiting method 1600 facilitating self-aligned gate cut on a dielectric fin extension in direct stacked VTFET.

FIG. 16 illustrates an example, non-limiting method 1600 facilitating self-aligned gate cut on a dielectric fin extension in direct stacked VTFET. At 1602, the method 1600 can comprise forming a silicon on insulator (SOI) semiconductor fin comprising a dielectric fin extension. At 1604, the method 1600 can comprise forming a first vertical transport field effect transistor (VTFET) comprising a first self-aligned gate (e.g., gate stack 109) on the dielectric fin extension. At 1606, the method 1600 can further comprise forming a second VTFET comprising a second self-aligned gate (e.g., gate stack 116) on the dielectric fin extension. At 1608, the method 1600 can further comprise forming a gate contact (e.g., gate contact 123) extending through the dielectric fin extension through the second VTFET to the first self-aligned gate (e.g., gate stack 109).

Figure 17:
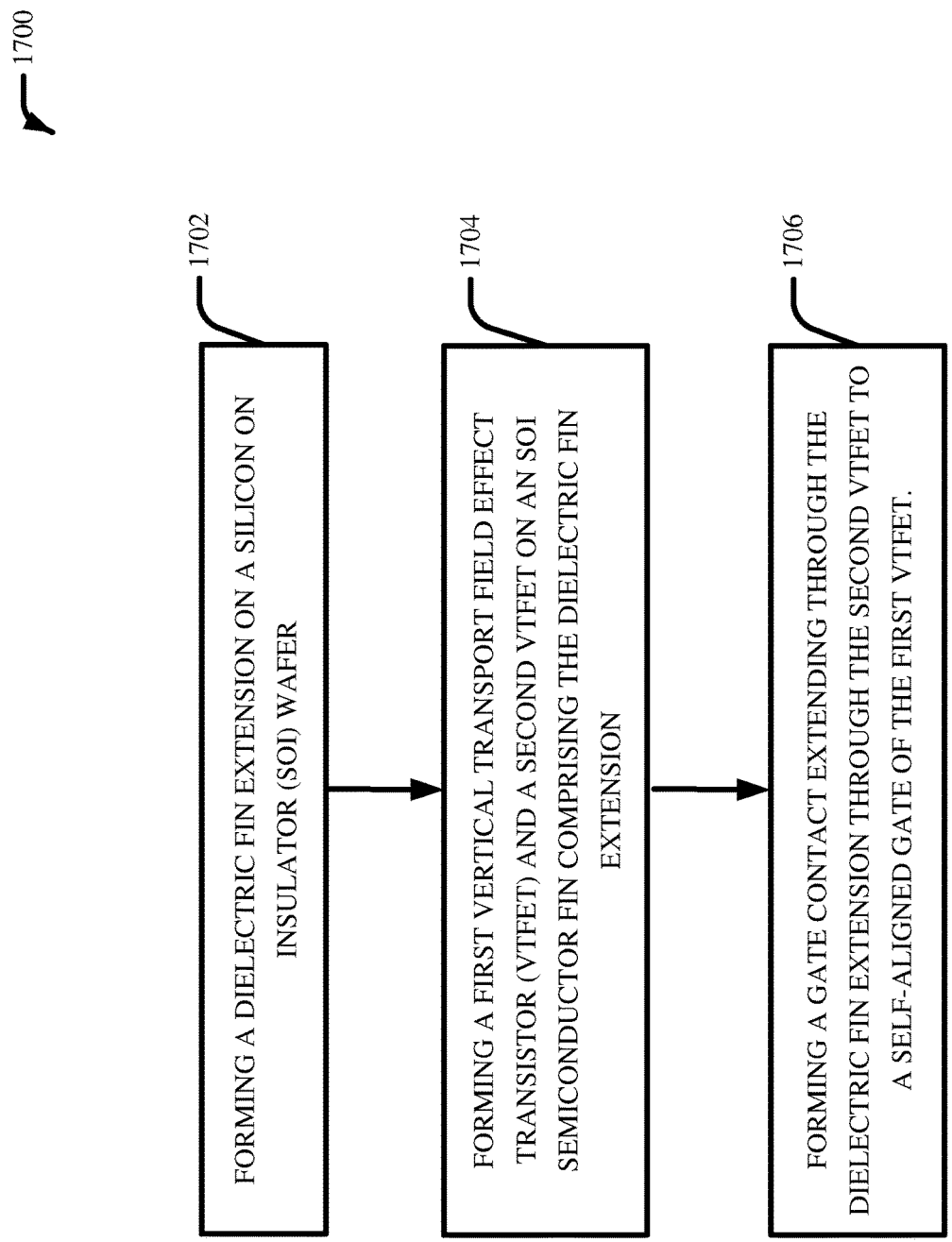
FIG. 17 illustrates an example, non-limiting method 1700 facilitating self-aligned gate cut on a dielectric fin extension in direct stacked VTFET.

FIG. 17 illustrates an example, non-limiting method 1700 facilitating self-aligned gate cut on a dielectric fin extension in direct stacked VTFET. At 1702, the method 1700 can comprise forming a dielectric fin extension on a silicon on insulator (SOI) wafer. At 1704, the method 1700 can further comprise forming a first vertical transport field effect transistor (VTFET) and a second VTFET on an SOI semiconductor fin comprising the dielectric fin extension. At 1706, the method 1700 can further comprise forming a gate contact (e.g., gate contact 123) extending through the dielectric fin extension through the second VTFET to a self-aligned gate (e.g., gate stack 109) of the first VTFET.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a silicon on insulator (SOI) semiconductor fin comprising a dielectric fin extension;
   a first vertical transport field effect transistor (VTFET) comprising a first self-aligned gate on the dielectric fin extension;
   a second VTFET comprising a second self-aligned gate on the dielectric fin extension; and
   a gate contact extending through the dielectric fin extension through the second VTFET to the first self-aligned gate.

2. The semiconductor structure of claim 1, further comprising a buried insulator disposed between an SOI wafer separating an SOI layer and a substrate layer.

3. The semiconductor structure of claim 2, further comprising a first dielectric fill patterned into the SOI wafer extending through the SOI layer, the buried insulator and partway through the substrate layer.

4. The semiconductor structure of claim 3, further comprising a hardmask disposed on the SOI layer, wherein the hardmask is used to pattern a hybrid fin comprising a semiconductor fin end and a dielectric fin end, wherein the dielectric fin end comprises the first dielectric fill and serves as the dielectric fin extension extending the length of the SOI semiconductor fin.

5. The semiconductor structure of claim 4, wherein the substrate layer serves as the first vertical fin channel for the first VTFET and the SOI layer serves as the second vertical fin channel for the second VTFET.

6. The semiconductor structure of claim 5, further comprising a first source and drain and a second source and drain over ends of the first vertical fin channel and a third source and drain and a fourth source and drain over ends of the second vertical fin channel.

7. The semiconductor structure of claim 6, wherein the first source and drain is formed on a base of the hybrid fin, wherein the second source and drain is formed by a first doped layer, wherein the third source and drain is formed by a second doped layer, and wherein the fourth source and drain is formed by the third doped layer.

8. The semiconductor structure of claim 7, further comprising a first spacer and a second spacer over the ends of the first vertical fin channel and a third spacer and a fourth spacer over the ends of the second vertical fin channel, wherein the first spacer is disposed on the first source and drain, the first doped layer is disposed on the second spacer, the third spacer is disposed on the second doped layer and the third doped layer is disposed on the fourth spacer.

9. The semiconductor structure of claim 8, wherein the first self-aligned gate is formed over the hybrid fin and etched back along a self-aligned horizontal surface of the hardmask and along a self-aligned horizontal surface the first spacer, and the second self-aligned gate is formed over the hybrid fin and etched back along a self-aligned horizontal surface of the hardmask and along a self-aligned horizontal surface of the third spacer.

10. The semiconductor structure of claim 9, further comprising a first interlayer dielectric and a second interlayer dielectric, wherein the first interlayer dielectric is disposed between and separates the first spacer and the second spacer, and the second interlayer dielectric is disposed between and separates the third spacer and the fourth spacer.

11. The semiconductor structure of claim 10, wherein the first self-aligned gate is further etched back along a self-aligned horizontal surface of the first interlayer dielectric, and the second self-aligned gate is further etched back along a self-aligned horizontal surface of the second interlayer dielectric.

12. The semiconductor structure of claim 3, further comprising an isolation spacer, wherein the isolation spacer is disposed alongside the buried insulator and separates the first VTFET and the second VTFET.

13. The semiconductor structure of claim 8, further comprising a second dielectric fill disposed alongside the hardmask and on the fourth doped layer.

14. The semiconductor structure of claim 13, wherein the gate contact extends through the second dielectric fill, the fourth doped layer, the fourth spacer, the second interlayer dielectric, the second self-aligned gate, the third spacer, the second doped layer, the isolation spacer, the first doped layer, the second spacer and stopping at the first interlayer dielectric and the first self-aligned gate.

15. The semiconductor structure of claim 14, wherein the gate contact accesses the second source and drain of the first VTFET.

16. A method, comprising:
forming a silicon on insulator (SOI) semiconductor fin comprising a dielectric fin extension;
forming a first vertical transport field effect transistor (VTFET) comprising a first self-aligned gate on the dielectric fin extension;
forming a second VTFET comprising a second self-aligned gate on the dielectric fin extension; and
forming a gate contact extending through the dielectric fin extension through the second VTFET to the first self-aligned gate.

17. The method of claim 16, further comprising using a gate contact mask to etch a contact trench and filling the contact trench with contact metal to form the gate contact.

18. The method of claim 16, wherein the gate contact accesses a source and drain of the first VTFET.

19. A method, comprising:
forming a dielectric fin extension on a silicon on insulator (SOI) wafer;
forming a first vertical transport field effect transistor (VTFET) and a second VTFET on an SOI semiconductor fin comprising the dielectric fin extension; and
forming a gate contact extending through the dielectric fin extension through the second VTFET to a self-aligned gate of the first VTFET.

20. The method of claim 19, wherein the gate contact accesses a source and drain of the first VTFET.

* * * * *